(12) United States Patent
Tanaka et al.

(10) Patent No.: US 10,306,366 B2
(45) Date of Patent: May 28, 2019

(54) AUDIO SYSTEM, AUDIO DEVICE, AND AUDIO SIGNAL PLAYBACK METHOD

(71) Applicant: YAMAHA CORPORATION, Hamamatsu-shi (JP)

(72) Inventors: Katsuaki Tanaka, Hamamatsu (JP); Tomoyoshi Akutagawa, Hamamatsu (JP); Hiroyuki Ichi, Hamamatsu (JP)

(73) Assignee: YAMAHA CORPORATION, Hamamatsu-shi (JP)

( * ) Notice: Subject to any disclaimer, the term of this patent is extended or adjusted under 35 U.S.C. 154(b) by 0 days.

(21) Appl. No.: 15/897,277

(22) Filed: Feb. 15, 2018

(65) Prior Publication Data

US 2018/0176685 A1 Jun. 21, 2018

Related U.S. Application Data

(63) Continuation of application No. PCT/JP2016/071571, filed on Jul. 22, 2016.

(30) Foreign Application Priority Data

Aug. 19, 2015 (JP) .................................. 2015-162326

(51) Int. Cl.
*H03G 5/16* (2006.01)
*H04R 3/12* (2006.01)
(Continued)

(52) U.S. Cl.
CPC .............. *H04R 3/12* (2013.01); *H03G 5/165* (2013.01); *H04R 27/00* (2013.01); *H04S 1/007* (2013.01);
(Continued)

(58) Field of Classification Search
CPC ................ H04R 3/12; H04R 2227/003; H04R 2227/005; H04R 2430/01; H04R 27/00;
(Continued)

(56) References Cited

U.S. PATENT DOCUMENTS 6,466,832 B1 10/2002 Zuqert et al.
7,539,889 B2 5/2009 Celinski et al.
(Continued)

FOREIGN PATENT DOCUMENTS

JP 2002524000 A 7/2002
JP 2007013707 A 1/2007
(Continued)

OTHER PUBLICATIONS

English translation of Written Opinion issued in Intl. Appln. No. PCT/JP2016/071571 dated Sep. 6, 2016, previously cited in IDS filed Feb. 15, 2018.
(Continued)

*Primary Examiner* — Paul Kim
*Assistant Examiner* — Friedrich Fahnert
(74) *Attorney, Agent, or Firm* — Rossi, Kimms & McDowell LLP

(57) ABSTRACT

Provided is an audio device, including: at least one processor; and at least one memory device that stores a plurality of instructions, which when executed by the at least one processor, cause the at least one processor to: play, with a given length of delay, a first-channel audio signal included in an audio signal; obtain one of operation information about operation of the audio device and setting information about playing of the audio signal; and transmit one of the operation information and the setting information, and at least a second-channel audio signal included in the audio signal, to another audio device.

10 Claims, 15 Drawing Sheets

(51) Int. Cl.
*H04R 27/00* (2006.01)
*H04S 1/00* (2006.01)
*H04M 1/725* (2006.01)

(52) U.S. Cl.
CPC ... *H04M 1/72558* (2013.01); *H04R 2227/003* (2013.01); *H04R 2227/005* (2013.01); *H04R 2430/01* (2013.01); *H04S 2400/13* (2013.01)

(58) Field of Classification Search
CPC ..... H03G 5/165; H04S 1/007; H04S 2400/13; H04M 1/72558
USPC ....... 381/77, 80, 102, 103; 700/94; 713/375, 713/401, 500
See application file for complete search history.

(56) References Cited

U.S. PATENT DOCUMENTS

| | | | |
|---|---|---|---|
| 8,233,635 | B2 | 7/2012 | Shiba |
| 8,788,080 | B1 | 7/2014 | Kallai et al. |
| 9,014,834 | B2 | 4/2015 | Kallai et al. |
| 9,036,841 | B2 * | 5/2015 | De Bruijn ............ H04R 1/323 381/300 |
| 9,202,509 | B2 | 12/2015 | Kallai et al. |
| 9,219,959 | B2 | 12/2015 | Kallai et al. |
| 9,665,341 | B2 | 5/2017 | Lin et al. |
| 9,756,424 | B2 | 9/2017 | Kallai et al. |
| 9,766,853 | B2 | 9/2017 | Kallai et al. |
| 9,778,898 | B2 * | 10/2017 | Millington ............ G06F 3/165 |
| 2007/0038999 | A1 | 2/2007 | Millington |
| 2007/0226530 | A1 * | 9/2007 | Celinski ............ G06F 1/12 713/500 |
| 2010/0220877 | A1 | 9/2010 | Ishibashi et al. |
| 2012/0237054 | A1 | 9/2012 | Eo et al. |
| 2013/0236029 | A1 * | 9/2013 | Millington ............ H04J 3/0664 381/80 |
| 2014/0226834 | A1 | 8/2014 | Kallai et al. |
| 2015/0287419 | A1 | 10/2015 | Chen et al. |
| 2016/0150320 | A1 * | 5/2016 | Hetke ............ H04R 3/12 381/80 |
| 2016/0291925 | A1 | 10/2016 | Kohara et al. |
| 2016/0309277 | A1 | 10/2016 | Hiscock |
| 2018/0115825 | A1 * | 4/2018 | Milne ............ H04R 3/12 |

FOREIGN PATENT DOCUMENTS

| | | |
|---|---|---|
| JP | 2009060372 A | 3/2009 |
| JP | 2009521882 A | 6/2009 |
| JP | 2011066544 A | 3/2011 |
| JP | 2015100085 A | 5/2015 |

OTHER PUBLICATIONS

English translation of Written Opinion issued in Intl. Appln. No. PCT/JP2016/071570 dated Sep. 6, 2016, previously cited in IDS filed Feb. 15, 2018.
International Preliminary Report on Patentability issued in Intl. Appln. No. PCT/JP2016/071571 dated Mar. 1, 2018.
International Preliminary Report on Patentability issued in Intl. Appln. No. PCT/JP2016/071570 dated Mar. 1, 2018.
Copending U.S. Appl. No. 15/825,601, filed Nov. 29, 2017 (a copy is not included because the cited application is not yet available to the public and the Examiner has ready access to the cited application).
International Search Report issued in Intl. Appln. No. PCT/JP2016/071571 dated Sep. 6, 2016. English translation provided.
Written Opinion issued in Intl. Appln. No. PCT/JP2016/071571 dated Sep. 6, 2016.
International Search Report issued in Intl. Appln. No. PCT/JP2016/071570 dated Sep. 6, 2016. English translation provided.
Written Opinion issued in Intl. Appln. No. PCT/JP2016/071570 dated Sep. 6, 2016.
Office Action issued in U.S. Appl. No. 15/825,601 dated Oct. 10, 2018.
Extended European Search Report issued in European Appln. No. 16836937.9 dated Mar. 25, 2019.

* cited by examiner

FIG.3

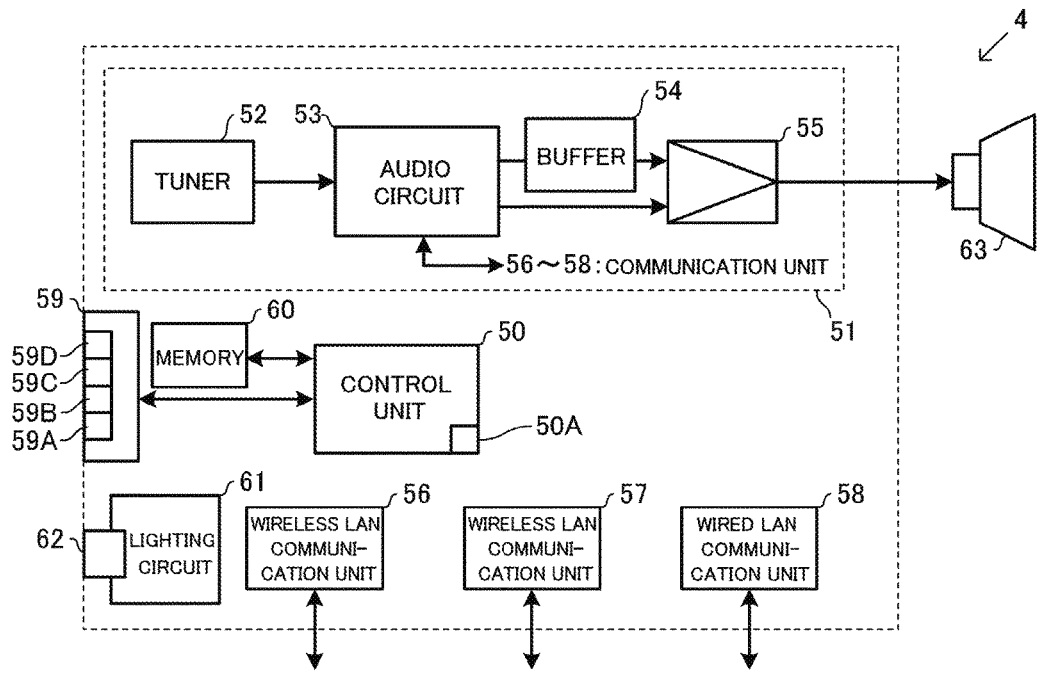

FIG.4

SYSTEM MANAGEMENT TABLE

| CONNECTION POINT | DEVICE TYPE | MAC ADDRESSES 1 AND 2 | AP SSID | STEREO PAIR SETTINGS | GROUP SETTINGS | PLAY PARAMETER |
|---|---|---|---|---|---|---|
| ROOT | AV RECEIVER | xx-xx-xx-xx-xx-xx<br>yy-yy-yy-yy-yy-yy | ****** | – | – | ****** |
| NODE 1 | FM RADIO | xx-xx-xx-xx-xx-xx<br>yy-yy-yy-yy-yy-yy | ****** | – | – | ****** |
| LEAF 1 | SPEAKER | xx-xx-xx-xx-xx-xx<br>yy-yy-yy-yy-yy-yy | ****** | (1, R, PARENT) | – | ****** |
| LEAF 2 | SPEAKER | xx-xx-xx-xx-xx-xx<br>yy-yy-yy-yy-yy-yy | ****** | (1, L, CHILD) | – | ****** |
| BRANCH 1 | DISC PLAYER | xx-xx-xx-xx-xx-xx<br>yy-yy-yy-yy-yy-yy | ****** | – | – | ****** |
| EXTERNAL ACCESS POINT INFORMATION | | | | | | |

FIG.13

SYSTEM MANAGEMENT TABLE

| CONNECTION POINT | DEVICE TYPE | MAC ADDRESSES 1 AND 2 | AP SSID | STEREO PAIR SETTINGS | GROUP SETTINGS | PLAY PARAMETER |
|---|---|---|---|---|---|---|
| ROOT | AV RECEIVER | xx-xx-xx-xx-xx-xx<br>yy-yy-yy-yy-yy-yy | ****** | – | – | ****** |
| NODE 1 | FM RADIO | xx-xx-xx-xx-xx-xx<br>yy-yy-yy-yy-yy-yy | ****** | – | (1, SLAVE) | ****** |
| LEAF 1 | SPEAKER | xx-xx-xx-xx-xx-xx<br>yy-yy-yy-yy-yy-yy | ****** | (1, R, PARENT) | (1, MASTER) | ****** |
| LEAF 2 | SPEAKER | xx-xx-xx-xx-xx-xx<br>yy-yy-yy-yy-yy-yy | ****** | (1, L, CHILD) | (1, SLAVE) | ****** |
| BRANCH 1 | DISC PLAYER | xx-xx-xx-xx-xx-xx<br>yy-yy-yy-yy-yy-yy | ****** | – | – | ****** |
| EXTERNAL ACCESS POINT INFORMATION ||||||||

AUDIO SYSTEM, AUDIO DEVICE, AND AUDIO SIGNAL PLAYBACK METHOD

CROSS-REFERENCE TO RELATED APPLICATION

The present application is continuation of International Application No. PCT/JP2016/071571 filed on Jul. 22, 2016, which claims priority from Japanese Application No. JP 2015-162326 filed on Aug. 19, 2015. The contents of these applications are hereby incorporated by reference into this application.

BACKGROUND OF THE INVENTION

1. Field of the Invention

The present invention relates to an audio system, an audio device, and an audio signal playback method. To give a specific example, the present invention relates to an audio system in which a network connects a plurality of audio devices, and an audio device included in the audio system.

2. Description of the Related Art

There is an audio system in which a LAN or a similar network (home network) connects a plurality of player devices, for example, audio devices respectively placed in a living room, a bedroom, and other rooms, and which allows a portable terminal device to control the playing of a music or other content on each of the audio devices (see Japanese Patent Application Laid-open No. 2015-100085, for example). The audio system described in Japanese Patent Application Laid-open No. 2015-100085 is configured so that the same content is played synchronously on a plurality of audio devices belonging to the same synchronized play group, which is set by a user on a portable terminal device.

SUMMARY OF THE INVENTION

The audio system described above is capable of synchronous play on a plurality of audio devices, but can only play/output the same sound on the audio devices. For instance, when content in the form of a stereo signal is to be played synchronously by a group to which two audio devices belong, and each of the audio devices only has a single speaker unit (a monaural speaker), the audio devices can only output the content in monaural. There is also a demand for the ability to set two audio devices to the same settings on an equalizer, a volume, and the like in stereo play.

It is an object of the present invention to provide an audio system and an audio device capable of playing audio in stereo while synchronizing setting information about play when, for example, two audio devices are used in combination for synchronous play.

According to one aspect of the present invention, there is provided an audio system including: a parent device configured to play, with a given length of delay, a first-channel audio signal included in an audio signal; a child device configured to obtain at least a second-channel audio signal included in the audio signal from the parent device, and play the second-channel audio signal; and an operation unit configured to obtain one of: operation information about operation of one of the parent device and the child device; and setting information about playing of the audio signal, wherein one of the operation information and the setting information is transferred to another one of the parent device and the child device.

According to one aspect of the present invention, there is provided an audio device including: at least one processor; and at least one memory device that stores a plurality of instructions, which when executed by the at least one processor, cause the at least one processor to: play, with a given length of delay, a first-channel audio signal included in an audio signal; obtain one of operation information about operation of the audio device and setting information about playing of the audio signal; and transmit one of the operation information and the setting information, and at least a second-channel audio signal included in the audio signal, to another audio device.

According to one aspect of the present invention, there is provided an audio signal playback method including: playing, by a parent device, a first-channel audio signal included in an audio signal with a given length of delay; obtaining, by a child device, at least a second-channel audio signal included in the audio signal from the parent device, and playing the second-channel audio signal; obtaining, by an operation unit, one of: operation information about operation of one of the parent device and the child device; and setting information about playing of the audio signal; and transferring one of the operation information and the setting information to another one of the parent device and the child device. In one embodiment of the present invention, the operation unit is provided to one of the parent device and the child device; and the audio signal playback method further comprises transferring one of the operation information and the setting information that is obtained by one of the parent device and the child device to another one of the parent device and the child device.

In one embodiment of the present invention, the operation unit is provided to a terminal device, which is capable of communication to and from one of the parent device and the child device; and the audio signal playback method further comprises transferring one of the operation information and the setting information that is obtained by the terminal device to the parent device and the child device.

In one embodiment of the present invention, further includes: transferring one of the operation information and the setting information via the parent device to one of the child device and a terminal device.

In one embodiment of the present invention, the operation information includes one of an instruction to play the audio signal and an instruction to stop the playing of the audio signal.

In one embodiment of the present invention, further includes: obtaining, by one of the parent device and the child device, the setting information transferred during a period in which the audio signal is being played, and playing one of the first-channel audio signal and the second-channel audio signal, depending on the setting information.

In one embodiment of the present invention, the setting information includes information about one of a volume and equalization of the audio signal.

In one embodiment of the present invention, further includes: setting one of two audio devices, which are included in an audio system, and have the same configuration, as the parent device and another one of the two audio devices as the child device.

BRIEF DESCRIPTION OF THE DRAWINGS

FIG. 3 is a block diagram of an audio device.

FIG. 4 is a diagram for illustrating an example of a system management table.

FIG. 13 is a diagram for illustrating another example of the system management table.

DETAILED DESCRIPTION OF THE INVENTION

Figure 1:
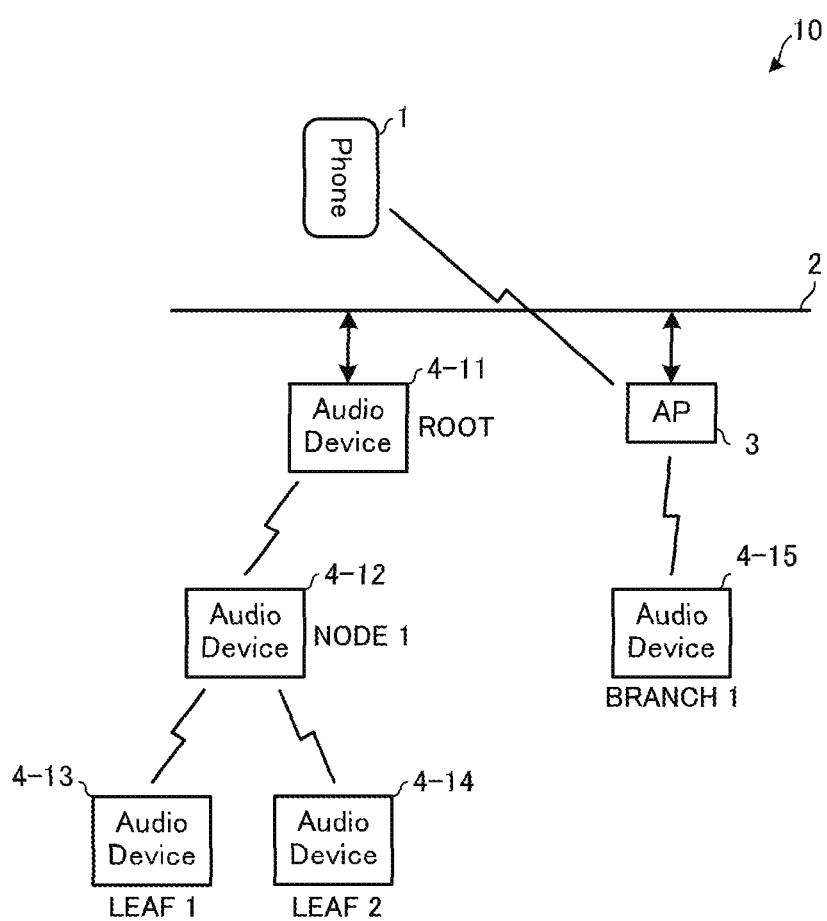
FIG. 1 is a diagram for illustrating the configuration of an audio system to which the present invention is applied.

FIG. 1 is a diagram for illustrating the configuration of an audio system 10 to which the present invention is applied. The audio system 10 includes a plurality of audio devices 4 (4-11 to 4-15) connected to one another by networks that include a wired LAN 2 and a wireless LAN, and a multi-function mobile phone 1, which functions as a controller 1. The audio devices 4 and the controller 1 transmit and receive an audio signal and a command message (command) through two-way communication over the networks. The audio devices 4, which are a part of the audio system 10, each have a wired LAN function and two wireless LAN functions.

The audio system 10 is capable of playing the same content synchronously on audio devices that are selected out of the audio devices 4-11 to 4-15 to be set as a group. The content is, for example, music. The audio source of the content is a CD loaded to the audio devices 4-11 to 4-15, music data stored on a hard disk or the like, or music data received from an FM broadcast or the like. The file format of the music data is, for example, MP3, WAV, SoundVQ (trademark), WMA (trademark), or AAC.

The audio system 10 is also capable of playing the same content synchronously in stereo on audio devices that are selected out of the audio devices 4-11 to 4-15 to be set as a pair (stereo pair setting). In the case where the audio devices 4-13 and 4-14 are set as a stereo pair, for example, the same content is played in stereo by outputting a right-channel audio signal that is included in music data (an audio signal) of the content from a speaker 63 of the audio device 4-13, and outputting a left-channel audio signal that is included in the music data from a speaker 63 of the audio device 4-14. Stereo pair setting is processing different from synchronous play group setting. In the following, stereo synchronous play in the stereo pair setting is expressed as "stereo play" to be differentiated from "synchronous play", which means synchronous play in group setting. Group setting and synchronous play are described later.

Each of the audio devices 4, which are a part of the audio system 10, has a wired LAN function and two wireless LAN functions as described above. The audio device 4 can activate an access point by using one of the two wireless LAN functions. The access point activated by the audio device 4 is called an internal access point 4A. The audio device 4 that is a lower level device is connected to the internal access point 4A. The internal access point 4A normally (except in initial connection, which is described later) operates in a stealth mode so that the presence of the internal access point 4A is not detected by other devices. The other of the two wireless LAN functions is used by the audio device 4 to function as a child device in a wireless LAN, and the child device is connected to one of the internal access point 4A of the audio device 4 that is a higher level device and an external access point 3.

The access point (external access point) 3 and the audio device 4-11 are connected to the wired LAN 2. The audio device 4-12 is connected by a wireless LAN to an internal access point 4A-11 of the audio device 4-11, which is at a level higher than the audio device 4-12. The audio devices 4-13 and 4-14 are connected by a wireless LAN to an internal access point 4A-12 of the audio device 4-12, which is at a level higher than the audio devices 4-13 and 4-14. The audio device 4-15 is connected to the external access point 3. The controller 1 holds communication to and from the audio devices 4 via the external access point 3.

For example, the Ethernet (trademark: IEEE 802.3) may be used as the wired LAN 2, and Wi-Fi (IEEE 802.11g) may be used as the wireless LANs.

The audio devices 4 are respectively called a root device, a node device, a leaf device, and a branch device, depending on the mode in which the particular audio device 4 is connected to the wired LAN 2. A root device is the highest level device connected directly (by a cable) to the wired LAN 2. In FIG. 1, the audio device 4-11 is the root device. The root device is an audio device that is registered first when the audio system 10 is built, and serves as the base point of the audio system 10. The root device activates the internal access point 4A for connecting the audio device 4 that is at a level lower than the root device to a network, and making the audio device 4 participate in the audio system 10.

A node device is an intermediate level device connected to a root device (the internal access point 4A of the root device) by a wireless LAN. In FIG. 1, the audio device 4-12 is a node device. The node device activates the internal access point 4A for connecting the audio device 4 that is at a level lower than the node device to a network, and making the audio device 4 participate in the audio system 10.

A leaf device is a lower level device connected to a node device (the internal access point 4A of the node device) by a wireless LAN. In FIG. 1, the audio devices 4-13 and 4-14 are leaf devices.

This audio system allows two node devices at maximum to connect to one root device in order to ensure high quality transmission of an audio signal. The audio system also allows two leaf devices at maximum to connect to each node device. The maximum number of hierarchical layers that can be created in connection that uses the internal access points 4A is three layers: root device layer—node device layer—leaf device layer. Seven audio devices at maximum, including a root device, can accordingly be connected by a wireless LAN tree that has the root device at the top. However, the number of tree layers and the number of lower level devices that can be connected to one audio device 4 in the present invention are not limited to those Given in this embodiment.

A branch device is the audio device 4 that is connected to the external access point 3 by a wireless LAN separately from the tree described above, and that holds communication to and from other audio devices 4 in the audio system 10 over the wired LAN 2. In FIG. 1, the audio device 4-15 is a branch device. The number of branch devices is not limited in the audio system 10. Leaf devices and branch devices do not activate the internal access points 4A.

When an audio system control program 70 (see FIG. 2) is activated on the mobile phone 1, the mobile phone 1 functions as the audio system controller (hereinafter shortened as "controller") 1. The mobile phone 1 (controller 1) holds communication to and from the audio devices 4 belonging to the audio system 10 over a network. Through this communication, the controller 1 controls an audio source to be played in the audio system 10 (for example, which music of the audio devices 4 is to be distributed to which audio devices), the volume of the audio source, or the like. The mobile phone 1 serving as the controller 1 further sets a group that performs synchronous play.

Figure 2:
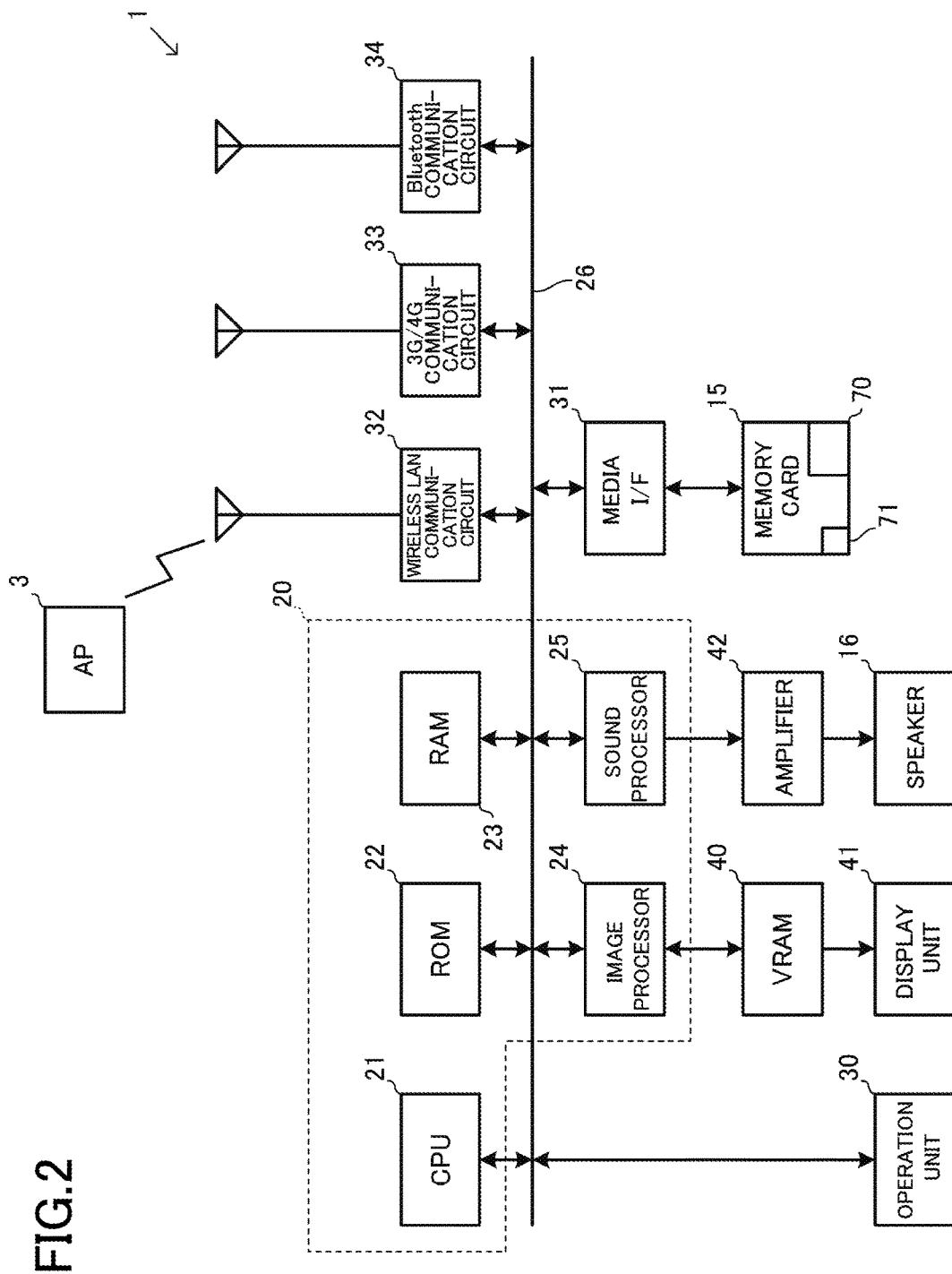
FIG. 2 is a block diagram of a mobile phone.

The configuration of the mobile phone 1 is described next with reference to the block diagram of FIG. 2. The mobile phone 1 is a multi-function phone called a smartphone. The mobile phone 1 has a 3G/4G communication function to hold communication over a 3G/4G network, which is a mobile communication network, a wireless LAN (Wi-Fi) communication function, and a Bluetooth (trademark) communication function. The mobile phone 1 functions as the controller 1 by activating the audio system control program 70, which is an application program, to control the audio system 10 by holding communication to and from the audio devices 4 of the audio system 10 via the access point 3 and transmitting a command message, such as play, that reflects a user's operation to the audio devices 4.

The mobile phone 1 includes, on a bus 26, a control unit 20, an operation unit 30, a media interface 31, a wireless LAN communication circuit 32, a 3G/4G communication circuit 33, and a Bluetooth (trademark) communication circuit 34. The control unit 20 includes a CPU 21, a ROM (flash memory) 22, a RAM 23, an image processor 24, and a sound processor 25. A video RAM (VRAM) 40 is connected to the image processor 24, and a display unit 41 is connected to the VRAM 40. The display unit 41 includes a liquid crystal display. On the display, for example, a standby screen or a phone number is displayed. When the mobile phone 1 functions as the controller 1, a screen for controlling the audio device 4 is displayed on the display. An amplifier 42 including a D/A converter is connected to the sound processor 25, and a speaker 16 is connected to the amplifier 42.

The image processor 24 includes a graphics processing unit (GPU) configured to generate various kinds of images such as a standby screen or a phone number. When the audio system control program 70 is activated, the image processor 24 generates an image of an audio controller in accordance with an instruction from the CPU 21, and places the image on the VRAM 40. The image placed on the VRAM 40 is displayed on the display unit 41.

The sound processor 25 includes a digital signal processor configured to encode/decode a telephone sound. The sound processor 25 outputs the decoded/generated sound to the amplifier 42. The amplifier 42 amplifies the sound signal for output to the speaker 16.

The wireless LAN communication circuit 32 is configured to hold wireless communication to and from a router in accordance with IEEE 802.11g or other standards in order to hold communication to and from the audio devices 4 via the access point 3. The 3G/4G communication circuit 33 is configured to make and receive a phone call and hold data communication over a mobile phone communication network. The Bluetooth communication circuit 34 is configured to hold communication to and from other Bluetooth-compatible devices in order to, for example, transmit and receive an audio signal.

The operation unit 30 includes a touch panel 30A (see FIG. 15A and FIG. 15B) formed on the display unit 41, and is configured to detect touch operation and flick operation on the touch panel 30A. When the audio system control program 70 is activated, the display unit 41 displays a plurality of operators including a set-up button and a scan button. The operation unit 30 detects the user's touch operation on the touch panel 30A and the coordinates of the touch operation to determine which operator has been operated.

A memory card 15 is connected to the media interface 31. The memory card 15 is a micro SD card, for example. The audio system control program 70 is stored on one of the memory card 15 and the ROM 22. The audio system control program 70 in this embodiment is stored on the memory card 15 as illustrated in FIG. 2. The audio system control program 70 may be downloaded through one of 3G/4G data communication and wireless LAN data communication, or may be stored on one of the ROM 22 and the memory card 15 in advance. A storage area 71 where the configuration of the audio system 10 (a system management table) is stored is set in the memory card 15.

A basic program for executing a telephone call or an application program of the mobile phone 1 is stored in the ROM 22. The ROM 22 is a flash memory, and can store downloaded application programs and other pieces of data in addition to the basic program. A work area to be used when the CPU 20 executes the audio system control program 70 is set in the RAM 23.

The configuration of the audio devices 4 is described next with reference to FIG. 3. Each audio device 4 includes a control unit 50, an audio processing unit 51, an operation unit 59, a memory 60, a lighting circuit 61, an LED 62, and the speaker 63, and also includes two wireless LAN communication units (RF modules) 56 and 57, and a wired LAN communication unit 58. The operation unit 59 includes a connect button 59A, a play/stop button 59B, a volume-up button 59C, and a volume-down button 59D. The control unit 50 includes a CPU and a memory, and stores an audio system program 50A. The control unit 50 uses the audio system program 50A to control the operation of the audio processing unit 51, the wireless LAN communication units 56 and 57, the wired LAN communication unit 58, and the lighting circuit 61. The control unit 50 executes the initial connection operation, which is the operation of connecting the audio device 4 to a network (the audio system 10), when the connect button 59A is pressed. A detailed description on the initial connection operation is omitted.

When the play/stop button 59B is pressed, the control unit 50 executes the operation of playing an audio source by controlling the audio processing unit 51 and other components. When the volume-up button 59C and the volume-down button 59D are pressed, the control unit 50 raises and lowers the volume of an audio source by controlling the audio processing unit 51. When the play/stop button 59B and the volume-up button 59C are concurrently pressed long (for example, 3 seconds), the control unit 50 executes stereo pair setting for a right channel (Rch). When the play/stop button 59B and the volume-down button 59D are concurrently pressed long (for example, 3 seconds), the control unit 50 executes a stereo pair setting for a left channel (Lch). The stereo pair setting is described later.

The control unit 50 also functions as a synchronous play controller, which is a master that controls the synchronous play of content, by executing the audio system program 50A.

The wireless LAN communication unit 56 is configured to hold wireless communication to and from the access point 3 and the audio device 4 that is at a level higher than its own audio device 4 in accordance with IEEE 802.11g or other wireless LAN standards. The other wireless LAN communication unit 57 is activated as an access point (the internal access point 4A) to relay the audio device 4 that is at a level lower than its own audio device 4 to the wired LAN 2. The wireless LAN communication unit 57 of the audio device 4-11, for example, relays the lower-level audio device 4-12 to the wired LAN 2. The wireless LAN communication unit 57 is also activated as an initial connection-use temporary access point when the audio device 4 is initially connected, to hold communication to and from the controller 1 (mobile phone 1). The operation in initial connection is described later. The two wireless LAN communication units 56 and 57 may be implemented by running one piece of hardware in a time division manner.

The wired LAN communication unit 58 includes a cable connector to communicate via the access point 3 over the wired LAN 2 in accordance with IEEE 802.3 or other communication standards. The controller 1, which is implemented in terms of hardware by the mobile phone 1, is connected to the access point 3, and the control unit 50 holds communication to and from the controller 1 over the wire LAN 2 or a wireless LAN to transmit an operation state and to receive a command message. The control unit 50 also transmits and receives necessary data to and from other audio devices 4 over a network when synchronous play is executed.

The internal access point 4A is assigned, as an SSID and a password, letter strings that can be determined from the MAC address of the wireless LAN communication unit 57. For example, a MAC address expressed in octets is used as the SSID and the lower three octets (device type ID+serial number) of the MAC address are used as the password. This enables an audio device that newly joins the audio system 10 to find the internal access point 4A based on the SSID, in other words, based on a vender ID and a device type ID in the MAC address, and to connect to the internal access point 4A by generating a password on its own. The audio device can thus be connected to the internal access point 4A without requiring the user to input an SSID and a password. The method of generating the SSID and password of the internal access point 4A is not limited to the one described above.

The audio processing unit 51 includes a tuner 52, an audio circuit 53, a buffer 54, and a power amplifier 55. The tuner 52 is configured to receive an audio signal from an FM broadcast or the Internet and to input the audio signal to the audio circuit 53. The audio circuit 53 is configured to perform equalization, volume adjustment, and other types of processing on the input audio signal. The audio circuit 53 is also configured to divide, when its own audio device 4 is set as a stereo pair, the input audio signal into an Rch audio signal and an Lch audio signal for stereo play by its own audio device 4 and the audio device 4 that is paired with its own audio device 4.

In the case where its own audio device 4 is set to Rch in the stereo pair setting, the audio circuit 53 separates an Rch audio signal from the input audio signal.

The audio circuit 53 outputs the processed audio signal to the power amplifier 55 through the buffer 54, or without involving the buffer 54. The audio circuit 53 determines whether or not to involve the buffer 54 in the output based on in what state (master/slave settings) its own audio device 4 belongs to a synchronous play group and based on the stereo pair settings (parent device/child device settings) of its own audio device 4. Details are described later.

The audio circuit 53 is capable of outputting the processed audio signal to the communication units 56, 57, and 58 in order to transmit the audio signal to other audio devices 4 for synchronous play or other purposes. An audio signal transmitted from another audio device 4 for synchronous play or other purposes is input to the audio circuit 53 via the communication unit 56, 57, or 58.

The buffer 54 is a memory configured to temporarily store an audio signal. When its own audio device 4 is set as a stereo pair, the buffer 54 delays the output of the audio signal to the power amplifier 55 by a given length of time to synchronize play on its own audio device 4 with play on the audio device 4 that is paired with its own audio device 4. The buffer 54 sets the delay time to the length of delay in communication between its own audio device 4 and the paired audio device 4.

The power amplifier 55 is configured to amplify the input audio signal and to output the amplified signal to the speaker 63, which is externally connected. The speaker 63 is, for example, a monaural speaker, and is configured to emit the input audio signal as a sound. The memory 60 is, for example, an EEPROM, and is configured to store the configuration of the audio system 10 (system management table) and other types of information.

The lighting circuit 61 is configured to light the LED 62. For instance, the lighting circuit 61 lights the LED 62 while the audio device 4 is activated, and informs the user of the activated state. The LED 62 in this embodiment is lighted by pressing only the play/stop button 59B long (for example, 3 seconds) while the audio device 4 is activated, to inform the state of the played channel in the stereo pair setting. In the case where the audio device 4 is set to Rch, the LED 62 blinks at short blinking intervals. In the case of Lch, the LED 62 blinks at a blinking interval longer than that in the case of Rch. The control unit 50 controls the blinking operation based on stereo pair setting information in the system management table, which is described later. Which channel is the played channel may be informed without using the LED 62 and, for example, the speaker 63 may instead emit a sound designed so that the played channel can be identified.

The audio devices 4-11 to 4-15 may each be a different device, but all have the basic configuration illustrated in FIG. 3 in terms of communication function and audio signal processing function.

FIG. 4 is a diagram for illustrating an example of a system management table. The audio devices 4 and the controller 1, which are a part of the audio system 10, each store the system management table. Information about the audio devices 4 belonging to the audio system 10 is written in the system management table. The information includes connection points, device types, upper and lower MAC addresses, the SSIDs of internal access points, stereo pair settings, group settings, play parameters, and external access points. The connection point is the connection mode described above which indicates how the audio device 4 is connected to the wired LAN 2, and has one of values "root", "node", "leaf", and "branch". The upper MAC address and the lower MAC address are the MAC addresses of the two wireless LAN communication units 56 and 57, and serve as information by which the device is identified in a wireless LAN.

The stereo pair settings (pair setting information) are information about two audio devices 4 that are paired with each other to play content in stereo. Specifically, information about a pair number, a parent-child relation, and a played channel (one of Rch and Lch) is written as stereo pair settings. The pair number is a number used to identify which two audio devices 4 are paired with each other. The parent-child relation is information used to identify which of the paired two audio devices 4 is the parent device and which of the paired audio devices 4 is the child device. The played channel is information used to identify which of the paired two audio devices 4 is to play an Rch audio signal and which of the paired two audio devices 4 is to play an Lch audio signal. The pair number information, the played channel information, and the parent-child relation information are written in the stated order as numerical value information in this embodiment.

In the example of FIG. 4, leaves 1 and 2 (the audio devices 4-13 and 4-14), which have a pair number "1", are set as a stereo pair. The audio device 4-13 is set to Rch as the parent device, and the audio device 4-14 is set to Lch as the child device. The audio devices 4-13 and 4-14 play an audio source (content) of the parent device in stereo, based on the stereo pair settings.

The parent device/child device settings are determined by the connection points of the respective audio devices 4. Each connection point is associated with a priority level. The priority level in this embodiment is highest at a root (wired connection), and decreases as the tree is followed down to a branch (router connection using an access point or the like), to a node, and then to a leaf. The connection point is accordingly equivalent to priority level information of the present invention. In the case where the paired audio devices 4 are equal to each other in priority level, the audio device 4 that is set to Rch, for example, is set as the parent device. The priority levels of the respective audio devices 4 can be set in a manner suited to individual cases. It is also not always necessary to base the parent device/child device settings on the priority levels. For example, the user may input parent device/child device settings.

The group settings are information on the audio devices 4 belonging to a group that performs synchronous play in the audio system 10. While the stereo pair settings described above are for synchronous play in stereo by two audio devices 4 that are paired with each other, synchronous play by the audio devices 4 that belong to a group is simply synchronous play of the same audio source. In the example of FIG. 4, no audio devices 4 are set as a group.

The play parameters are setting information about play on the audio devices 4 and include, for example, setting information about an equalizer and a volume. In a parent device and a child device set as a stereo pair, a play parameter of the parent device serves as a common play parameter, which means that the parent device and the child device have the same play parameter. The audio device 4-13 (the parent device) and the audio device 4-14 (the child device), which are illustrated as an example in FIG. 4, share the same play parameter.

External access point information in the system management table is information about an external access point to which one of the controller 1 and the branch device 4 is connected. The SSID, password, and the like of this external access point are written as the external access point information. Information stored in the system management table is not limited to the one illustrated in FIG. 4.

The system management table is created by the controller 1, which controls the audio system 10, and is distributed to each audio device 4. The control unit 50 of each of the audio devices 4-11 to 4-15 accordingly stores the system management table of FIG. 4. Further, the controller 1 and the audio device 4 update the information of the audio system management table.

The controller 1 builds the audio system 10 by registering the first audio device 4-11 as a root device, and can then add the second audio device 4-12, and subsequent audio devices 4 to the built audio system 10. When the user inputs group registration operation, the controller updates the group settings and transmits the updated settings to each audio device 4.

A stereo pair is set by operating the audio devices 4 that are to be paired with each other, instead of operating the controller 1 for pair registration. The controller 1 updates the stereo pair settings in the system management table by receiving information about stereo pair settings that are newly set from the audio device 4 that serves as the parent device, and then transmits the updated settings to each audio device 4.

Figure 5:
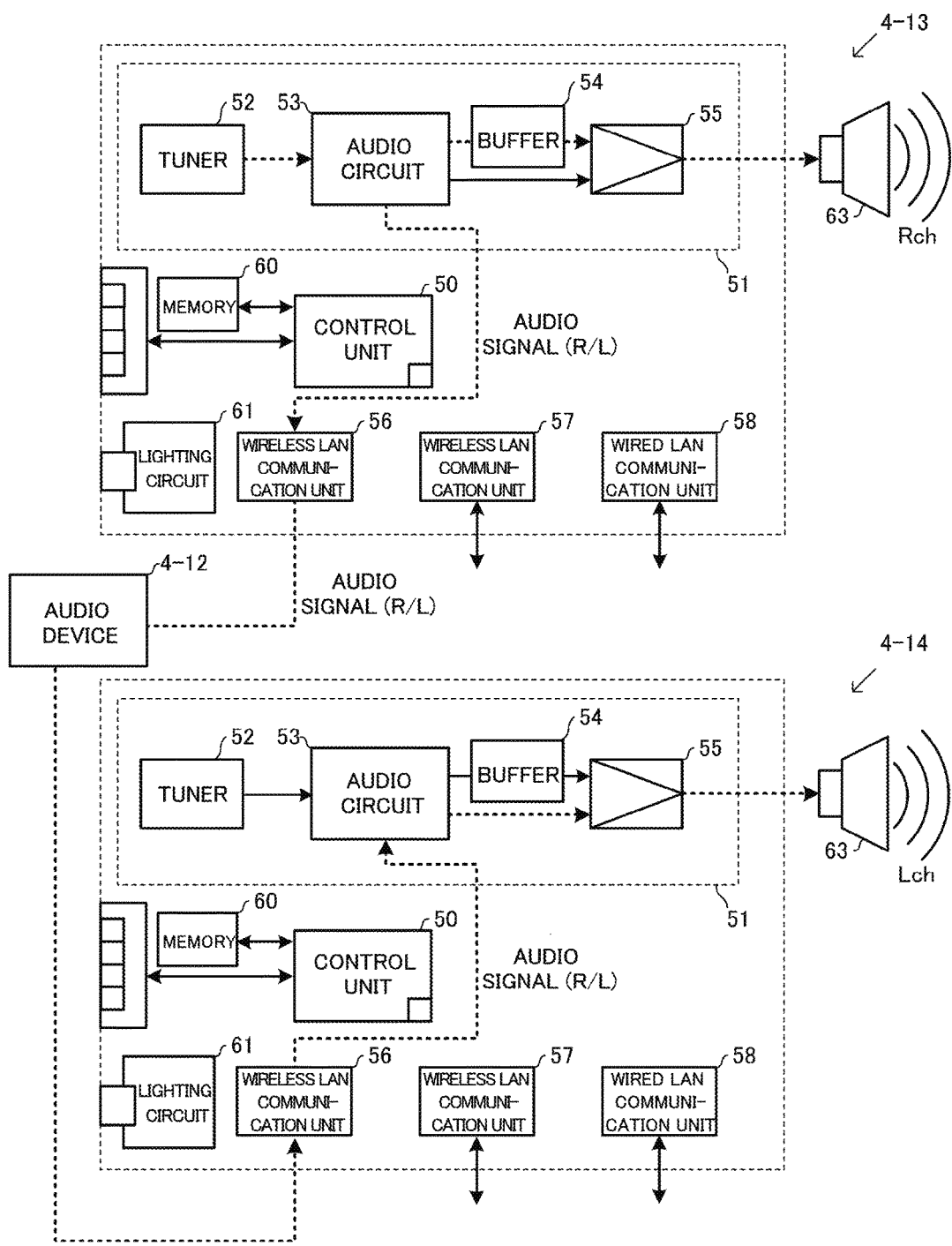
FIG. 5 is a block diagram of two audio devices set as a stereo pair.

Stereo play is described next with reference to the block diagram of FIG. 5. In FIG. 5, the audio device 4-13 is set to Rch and as the parent device, and the audio device 14-4 is set to Lch and as the child device as in the example of FIG. 4. The following description may use expressions "parent device 4-13" and "child device 4-14". The parent device 4-13 and the child device 4-14 do not belong to a group at the moment.

In stereo play, an audio signal of an audio source located in the parent device 4-13 is played. For example, an audio signal of an FM broadcast received by the tuner 52 of the parent device 4-13 is played in stereo. The audio signal of the FM broadcast contains audio signals of two channels, Rch and Lch. In the following, an audio signal that contains audio signals of two channels may be expressed as "audio signal (R/L)", whereas an audio signal that contains only an audio signal of one channel is expressed as one of "audio signal (R)" and "audio signal (L)".

The audio circuit 53 in the parent device 4-13 receives the audio signal (R/L) from the tuner 52, performs equalization, volume adjustment, and other types of processing on the input audio signal (R/L), and copies the processed signal to obtain two audio signals (R/L) for distribution. The audio circuit 53 of the parent device 4-13 separates an Rch audio signal (R) from one of the audio signals (R/L) created by copying for distribution, and outputs the audio signal (R) to the buffer 54. The audio circuit 53 of the parent device 4-13 also outputs, to the wireless LAN communication unit 56, the remaining audio signal (R/L). The wireless LAN communication unit 56 of the parent device 4-13 sends the audio signal (R/L) to the child device 4-14 (wireless LAN communication unit 56) through data transmission.

The wireless LAN communication unit 56 of the child device 4-14 outputs the received audio signal (R/L) to the audio circuit 53. The audio circuit 53 of the child device 4-14 separates an Lch audio signal (L) from the audio signal (R/L), and outputs the audio signal (L) to the power amplifier 55 without involving the buffer 54.

The parent device 4-13 utilizes a delay caused by the buffer 54 to synchronize the timing of outputting the audio signal (R) from its speaker 63 with the timing of output from the speaker 63 of the child device 4-14. In other words, the buffer 54 adjusts the output timing of the parent device 4-13 by a length of time equal to the length of delay (a given length of time) that is due to the transmission of the audio signal from the parent device 4-13 to the child device 4-14. An Rch sound and an Lch sound are therefore ultimately output from the speaker 63 of the parent device 4-13 and the speaker 63 of the child device 4-14, respectively, in a synchronized state. In stereo play, play that involves the buffer 54 is called delayed play and play that does not involve the buffer 54 is called undelayed play.

Figure 6:
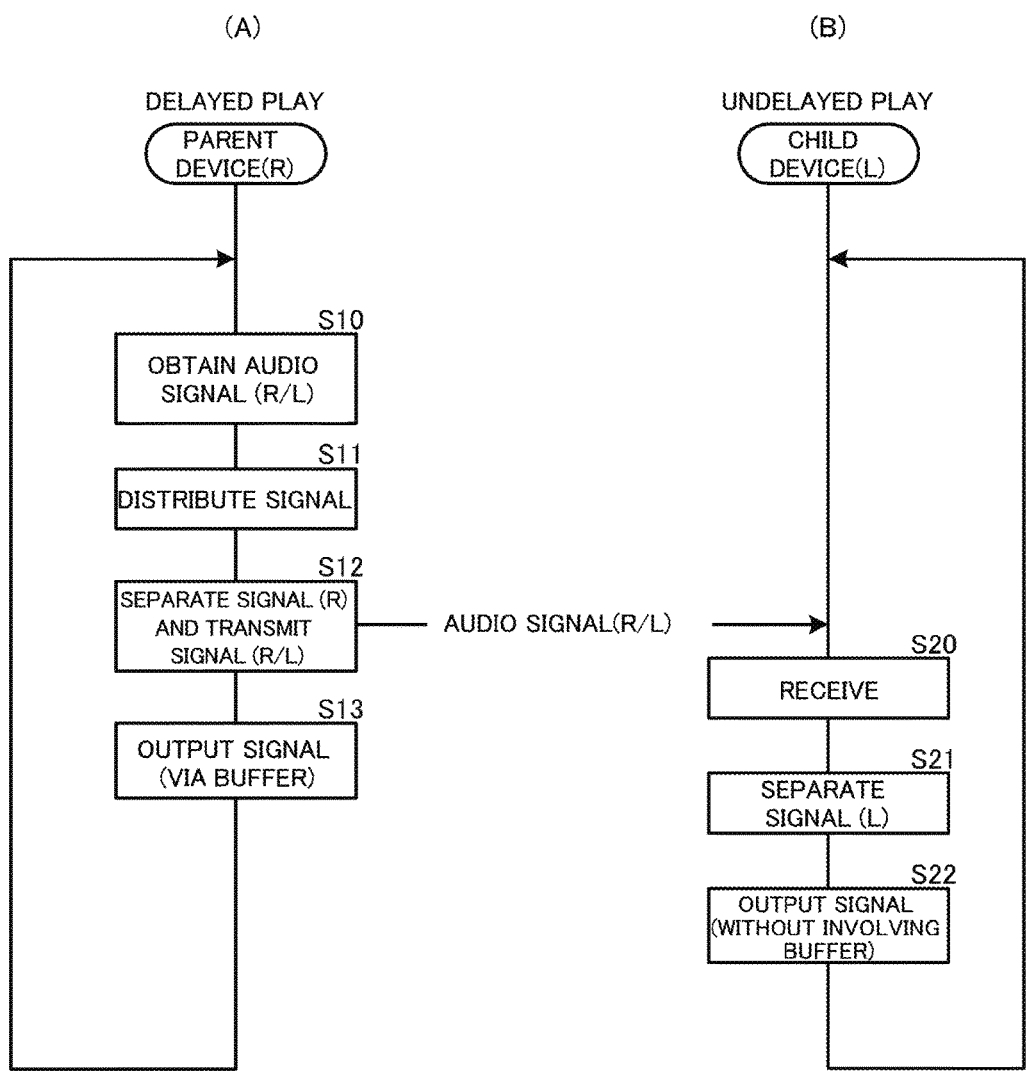
FIG. 6 is a flow chart for illustrating stereo play processing (delayed play processing and undelayed play processing), which is executed by control units of the audio devices.

FIG. 6 is a flow chart for illustrating the stereo play processing described above. FIG. 6(A) is a flow chart of delayed play processing, and FIG. 6(B) is a flow chart of undelayed play processing. The stereo play processing is executed when, for example, the user operates the controller 1 so that the parent device receives an operation command to play a specified audio source from the controller 1. The controller 1 excludes, as the recipient of the play operation command, the child device currently set as a stereo pair.

The stereo play processing is described taking as an example a case in which the audio device 4-13 is the parent device 4-13 (Rch), the audio device 4-14 is the child device 4-14 (Lch), and an audio source (audio signal) of an FM broadcast on the parent device 4-13 is played as in the example described above.

The parent device 4-13 receives an audio signal (R/L) of an FM broadcast (Step S10), and copies the received signal to obtain two audio signals (R/L) for distribution (Step S11). The parent device 4-13 next extracts an Rch audio signal (R) from one of the audio signals (R/L) created by copying for distribution, and transmits the received audio signal (R/L) to the child device 4-14 (Step S12). The parent device 4-13 then outputs the separated audio signal (R) to the power amplifier 55 via the buffer 54 (Step S13).

Meanwhile, the child device 4-14 receives the audio signal (R/L) from the parent device 4-13 (Step S20), and separates an Lch audio signal (L) from the audio signal (R/L) (Step S21). The child device 4-14 then outputs the separated audio signal (L) to the power amplifier 55 without involving the buffer 54 (Step S22).

The parent device 4-13 and the child device 4-14 execute the processing described above repeatedly to perform stereo play until the playing is stopped. An alternative setting may be employed in which the parent device is set to Lch and the child device is set to Rch.

Stereo pair setting processing is described next with reference to the flow charts of FIG. 7. FIG. 7(A) is a flow chart for illustrating Rch stereo pair setting processing. FIG. 7(B) is a flow chart for illustrating Lch stereo pair setting processing. Rch stereo pair setting processing and Lch stereo pair setting processing each include identifying two audio devices 4 to be paired with each other, setting the parent device and the child device, and setting Rch and Lch.

The Rch stereo pair setting processing is executed when the play/stop button 59B and the volume-up button 59C are concurrently pressed long on the audio device 4 that is to be set to Rch in the stereo pair setting. The execution of the Lch stereo pair setting processing, on the other hand, is started when the play/stop button 59B and the volume-down button 59D are concurrently pressed long on the audio device 4 that is to be set to Lch in the stereo pair setting. In short, whether an audio device is set to Rch or Lch in the stereo pair setting is determined at the start of the stereo pair setting processing, depending on which of the combinations of buttons described above is pressed long.

The stereo pair setting processing is described below taking as an example a case in which the play/stop button 59B and the volume-up button 59C are concurrently pressed long on the audio device 4-13, and the play/stop button 59S and the volume-down button 59D are concurrently pressed long on the audio device 4-14.

The audio device 4-13 obtains, from the system management table, its own connection point (priority level information), MAC address 1 (identification information), and play parameter, and the MAC addresses 1 of the audio devices 4-11, 4-12, and 4-15 other than the audio device 4-13 (Step S30). The audio device 4-13 then transmits a standby notification including the obtained connection point, MAC address 1, and play parameter to the other audio devices 4-11, 4-12, and 4-15 in the audio system 10 by multi-casting (Step S31).

Meanwhile, the audio device 4-14 receives the standby notification transmitted by multi-casting (Step S40), and compares the received connection point and its own connection point to determine a parent-child relation (Step S41). The audio devices 4-13 and 4-14 are equally leaves and have the same priority level. The audio device 4-13, which is set to Rch, is accordingly determined as the parent device.

The audio device 4-14 next updates its own system management table (Step S42). Specifically, the stereo pair setting information is updated. The audio device 4-14 further updates its own system management table with the play parameter received along with the standby notification being used as its own play parameter, when the audio device 4-13 serves as the parent device. When the audio device 4-13 serves as the child device, on the other hand, the audio device 4-14 does not update the play parameter. The audio device 4-14 then transmits an acknowledgment notification (ACK) including the parent-child relation, its own play parameter, and its own MAC address to the audio device 4-13 by uni-casting (Step S43).

After that, the audio device 4-13 receives the acknowledgment notification (Step S32), and updates the stereo pair setting information in its own system management table in the same way that is described above (Step S33). In this case also, the audio device 4-13 updates its own system management table with the play parameter received along with the acknowledgement notification being used as its own play parameter, when the audio device 4-14 serves as the parent device. When the audio device 4-14 serves as the child device, on the other hand, the audio device 4-13 does not update the play parameter. Stereo settings in the system management table are updated to the information illustrated in FIG. 4 in this manner.

Then, for example, after the stereo pair setting processing described above, the parent device 4-13 transmits the updated information of the system management table to the controller 1.

The audio device 4-13 transmits a standby notification by multi-casting in Step S31. In the case where multi-cast transmission is repeated for five minutes without receiving an acknowledgment information, the audio device 4-13 can end the processing on account of time out. In the case where a standby notification is not received in, for example, 5 minutes since the start of the Lch stereo pair setting processing, the audio device 4-14 can end the processing on account of time out.

Whichever of the Rch stereo pair setting processing and the Lch stereo pair setting processing can be started first as long as each is started at timing that avoids time out.

The priority level information is included in the transmitted standby notification in the stereo pair setting processing described above, so that the audio device 4 that receives the notification determines a parent-child relation. However, in the case where each audio device 4 stores the priority level information of every audio device 4, the parent-child relation may be determined in each audio device 4. The standby notification in this case does not need to include connection point information, and the acknowledgment notification in this case does not need to include a parent-child relation. The play parameter also does not need to be included in the standby notification and the acknowledgement notification when each audio device 4 stores the play parameter of every audio device 4.

Stereo pair breaking processing is described next with reference to the flow chart of FIG. 8. In the stereo pair breaking processing, stereo pair settings that are currently set are cancelled (reset). This processing is started when canceling operation is performed on one of the parent device and the child device. The execution of the stereo pair breaking processing is started when, for example, the play/stop button 595 and the volume-up button 59C are concurrently pressed long on one of the parent device and the child device, by one of the parent device and the child device on which the buttons are pressed long. A case where the play/stop button 59B and the volume-up button 59C are concurrently pressed long on the child device 4-14 is described below with the use of the above example of FIG. 4.

The child device 4-14 transmits a cancellation notification to the parent device 4-13 by uni-casting (Step S50). The child device 4-14 next updates its own system management table (Step S51). Specifically, stereo pair setting information about the parent device 4-13 and the child device 4-14 is deleted. In Step S51, the child device 4-14 may set the play parameter back to its own play parameter that has been set prior to stereo setting. It suffices that the play parameter that has been set prior to stereo setting is stored in another storage area in this case.

Meanwhile, the parent device 4-13 receives the cancellation notification (Step S60), and updates its own system management table in the same way that is described above (Step S61). An acknowledgment notification to the child device 4-14, which has transmitted the cancellation notification, is unnecessary. In this manner, the stereo pair settings set to the parent device 4-13 and the child device 4-14 can be cancelled even when the parent device 4-13 and the child device 4-14 are disconnected from a network and cannot hold communication to and from each other.

Figure 8:
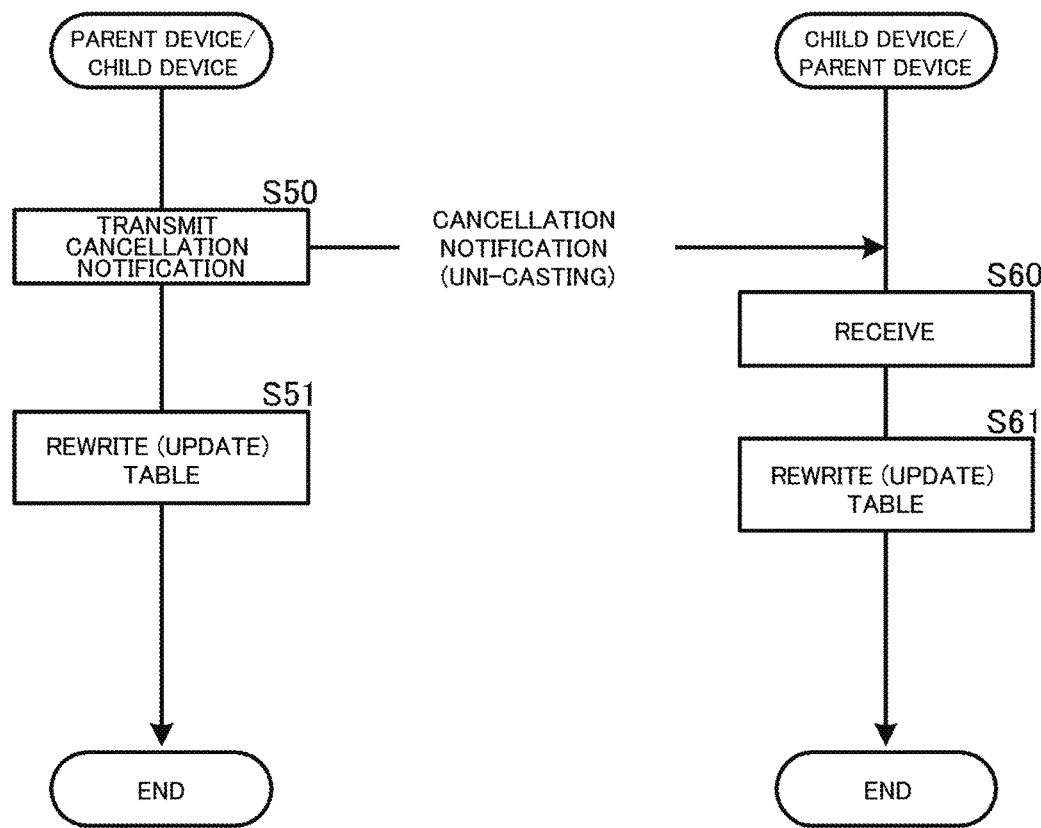
FIG. 8 is a flow chart for illustrating stereo pair breaking processing, which is executed by the control units of the audio devices.

In the case where the parent device 4-13 is disconnected from a network, for example, the parent device 4-13 cannot receive the cancellation notification from the child device 4-14, but the child device 4-14 itself can cancel the stereo pair settings as illustrated in FIG. 8. The stereo pair settings in the parent device 4-13, on the other hand, are cancelled separately by the user concurrently pressing the play/stop button 59B and the volume-up button 59C long on the parent device 4-13.

Figure 9:
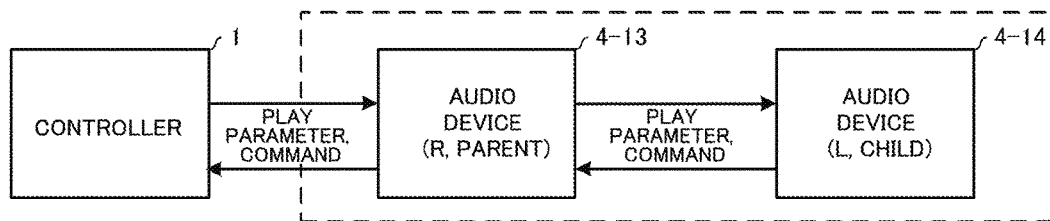
FIG. 9 is an explanatory diagram for illustrating modes of transmitting a command between the audio devices set as a stereo pair.
Figure 10:
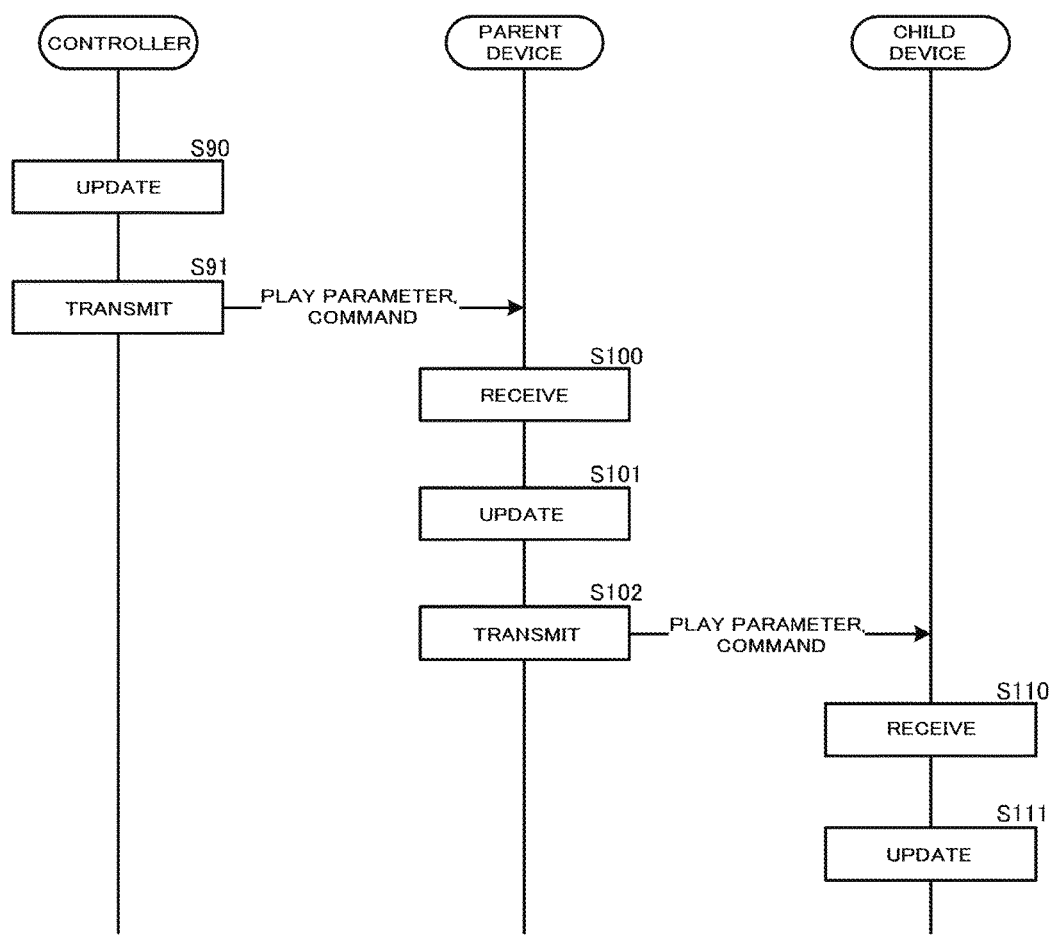
FIG. 10 is a flow chart for illustrating play parameter update processing and play/stop command transmission processing that are executed by a control unit of a controller.
Figure 11:
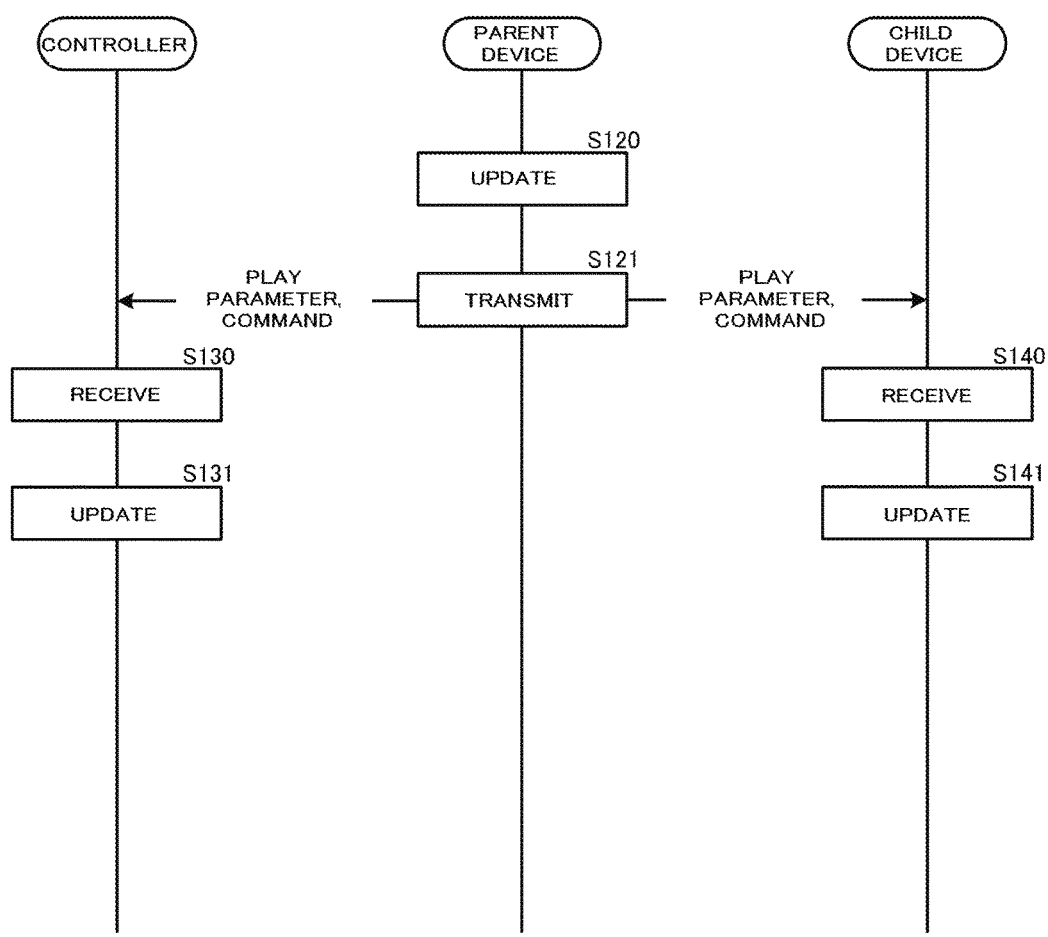
FIG. 11 is a flow chart for illustrating play parameter update processing and play/stop command transmission processing that are executed by the control unit of one of the audio devices (the parent device).
Figure 12:
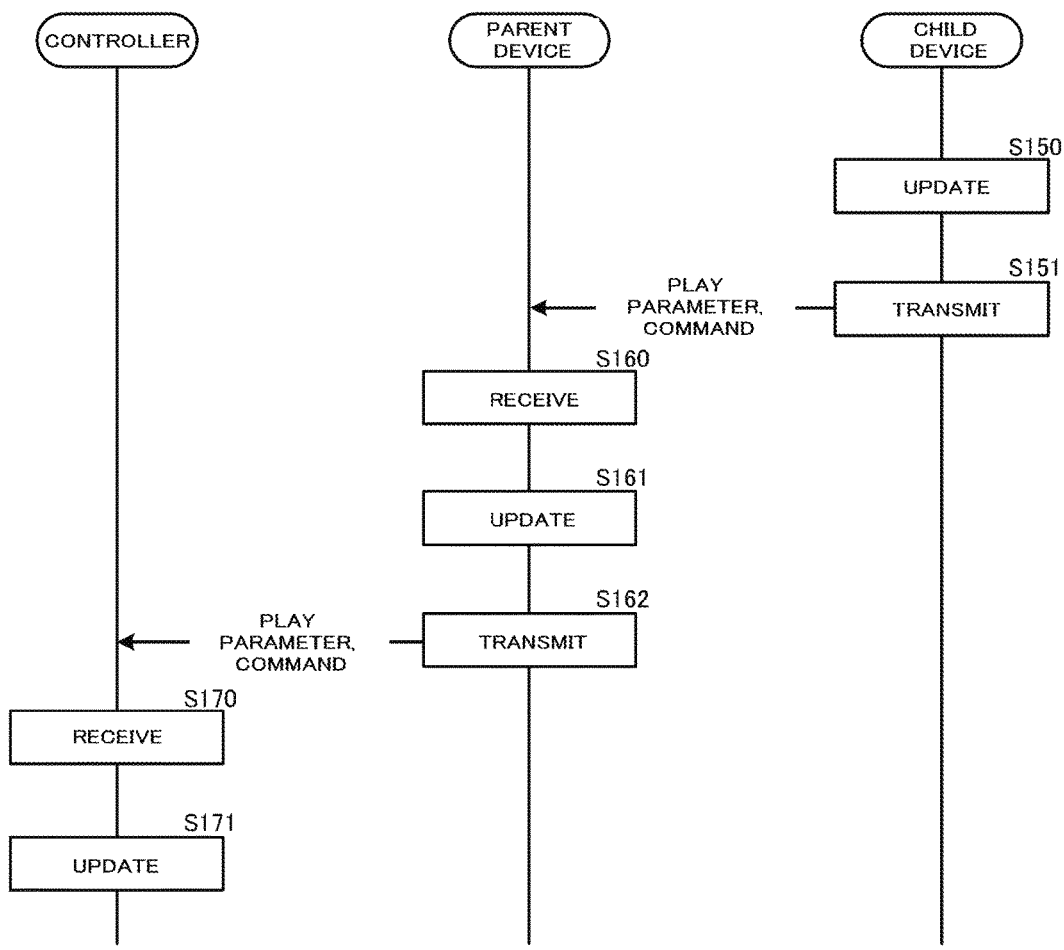
FIG. 12 is a flow chart for illustrating play parameter update processing and play/stop command transmission processing that are executed by the control unit of one of the audio devices (the child device).

Play parameter update processing and play/stop command transmission processing of the audio devices 4 that are set as a stereo pair are described next with reference to FIG. 9 to FIG. 12. FIG. 9 is an explanatory diagram for illustrating modes of transmitting a command between audio devices set as a stereo pair. FIG. 10 is a flow chart for illustrating play parameter update processing and play/stop command transmission processing that are executed by the controller 1. FIG. 11 is a flow chart for illustrating play parameter update processing and play/stop command transmission processing that are executed by the parent device. FIG. 12 is a flow chart for illustrating play parameter update processing and play/stop command transmission processing that are executed by the child device.

In this embodiment, the user can change play parameter settings of the audio devices 4 set as a stereo pair by operating the operation units 59 (the volume-up buttons 59C, the volume-down buttons 59D, and others) of the parent device and the child device, or the operation unit 30 (the touch panel 30A) of the controller 1. The change is reflected on both the play parameters of the parent device and the child device because the parent device and the child device have the same play parameter when a stereo pair is set.

A play/stop command is an instruction to play/stop (including pause) content. The audio device 4 that has received a play/stop command starts playing or performing other such operation as instructed by the command. When a stereo pair is set, a play/stop command is issued in response to the user's operation of the operation units 59 (the play/stop button 59B) on the parent device and the child device, or the operation unit 30 (the touch panel 30A) of the controller 1.

The processing steps of the play parameter update processing and the play/stop command transmission processing in this embodiment vary depending on which of the operation unit 30 of the controller 1 and the operation units 59 of the parent device and the child device is operated by the user to execute the processing. The controller 1, while capable of changing play parameter settings of each audio device 4, cannot be operated to update the play parameter of the child device or to play/stop the child device alone. This is because the child device is treated as one with the parent device in the display mode of the controller 1.

A case illustrated in FIG. 9 in which the audio device 4-13 is the parent device 4-13 and the audio device 4-14 is the child device 4-14 is described as an example. The parent device 4-13 and the child device 4-14 are treated as one as mentioned above. This means that, when the play parameter is changed by the controller 1, the updated play parameter and an update command are transmitted from the controller 1 to the parent device 4-13 alone. The updated play parameter and the update command are then transmitted (transferred) from the parent device 4-13 to the child device 4-14. The update command is a command instructing to update the play parameter.

When it is the parent device 4-13 that is operated to change the play parameter, the updated play parameter and an update command are transmitted from the parent device 4-13 to the controller 1 and the child device 4-14 separately. When it is the child device 4-14 that is operated to chancre the play parameter, the updated play parameter and an update command are transmitted from the child device 4-14 to the parent device 4-13 alone. The updated play parameter and the update command are then transmitted from the parent device 4-13 to the controller 1. The same applies to a play command and other commands. In this embodiment, the parent device out of the parent device and child device treated as one thus handles communication to and from other devices.

The above-mentioned case in which the controller 1 (the operation unit 30) is operated to change the play parameter settings of the parent device 4-13 is described next with reference to the flow chart of FIG. 10. In the example described, the parent device 4-13 and the child device 4-14 are used as in FIG. 9.

The controller 1 updates the play parameter based on operation information received by the operation unit 30 (Step S90). The play parameter of the child device 4-14 in this case is updated in the same way in which the play parameter of the parent device 4-13 is updated. The controller 1 next transmits the updated play parameter along with an update command to the parent device 4-13 (Step S91).

The parent device 4-13 receives the play parameter and the update command from the controller 1 (Step S100), and updates the play parameter currently stored in the system management table to the received play parameter (Step S101). The parent device 4-13 next transmits an update command along with the received play parameter to the child device 4-14 (Step S102).

The child device 4-14 receives the play parameter and the update command from the parent device 4-13 (Step S110), and updates the play parameter currently stored in the system management table to the received play parameter (Step S111). The play parameters of the parent device 4-13 and the child device 4-14 are synchronized with the play parameter changed on the controller 1 in this manner. The controller 1 may subsequently transmit the updated information of the system management table and an update command to the audio devices 4 other than the parent device 4-13 and the child device 4-14.

The same processing is executed to transmit a play/stop command to the parent device and the child device. In the case of a play command, for example, play statuses of the parent device and the child device are updated by the controller 1 during play (Step S90), and a play command is transmitted from the controller 1 to the parent device, and then from the parent device to the child device (Step S91 and Step S102). The play status is information indicating the play state of each audio device 4. The parent device and the child device receive the play command and execute play processing illustrated in FIG. 6 to play content. It suffices that the controller 1, which does not play audio, only updates the play statuses of the parent device and the child device when receiving a play command.

The above-mentioned case in which the operation unit 59 of the parent device 4-13 is operated to change the play parameter is described next with reference to the flow chart of FIG. 11. The operation unit 59 of the parent device 4-13 receives an operation input that changes the play parameter settings of the parent device 4-13 alone.

The parent device 4-13 updates the play parameter based on operation information received by the operation unit 59 (Step S120). The play parameter of the child device 4-14 in this case is updated in the same way in which the play parameter of the parent device 4-13 is updated. The parent device 4-13 next transmits the updated play parameter along with an update command to the controller 1 and the child device 4-14 (Step S121).

The controller 1 and the child device 4-14 receive the play parameter and the update command from the parent device 4-13 (Step S130 and Step S140), and updates the play parameter currently stored in the system management table to the received play parameter (Step S131 and Step S141). The play parameters of the controller 1 and the child device 4-14 are synchronized with the play parameter changed on the parent device 4-13 in this manner. The controller 1 may subsequently transmit the updated information of the system management table and an update command to the audio devices 4 other than the parent device 4-13 and the child device 4-14.

The same processing is executed to transmit a play/stop command to the controller 1 and the child device. In the case of a play command, for example, the play statuses of the parent device and the child device are updated (Step S120), and a play command is transmitted from the parent device to the child device and the controller 1 (Step S121). The parent device and the child device, which have received the play command, execute play processing illustrated in FIG. 6 to play content.

The above-mentioned case in which the operation unit 59 of the child device 4-14 is operated to change the play parameter is described next with reference to the flow chart of FIG. 12. The operation unit 59 of the child device 4-14, which is in a state of being set as the child device of a stereo pair, receives an operation input supposed to change the play parameter settings of the parent device 4-13.

The child device 4-14 updates the play parameter based on operation information received by the operation unit 59 (Step S150). In this case, the play parameter for the parent device 4-13 and the child device 4-14 is updated. The child device 4-14 next transmits the updated play parameter along with an update command to the parent device 4-13 (Step S151).

The parent device 4-13 receives the play parameter and the update command from the child device 4-14 (Step S160), and updates the play parameter currently stored in the system management table to the received play parameter (Step S161). The parent device 4-13 next transmits an update command along with the received play parameter to the controller 1 (Step S162).

The controller 1 receives the play parameter and the update command from the parent device 4-13 (Step S170) and updates the play parameter currently stored in the system management table to the received play parameter (Step S171). The play parameters of the parent device 4-13 and the controller 1 are synchronized with the play parameter changed on the child device 4-14 in this manner. The controller 1 may subsequently transmit the updated information of the system management table and an update command to the audio devices 4 other than the parent device 4-13 and the child device 4-14.

The same processing is executed to transmit a play/stop command to the controller 1 and the parent device. In the case of a play command, for example, the play statuses of the parent device and the child device are updated during play (Step S150), and a play command is transmitted from the child device to the parent device, and then from the parent device to the controller 1 (Step S151 and Step S162). The parent device and the child device receive the play command and execute play processing illustrated in FIG. 6 to play content.

Other than a play/stop command, a power on/off command instructing to power on/off a part of each audio device 4 that functions as a player device can be transmitted by the same steps.

Figure 14A:
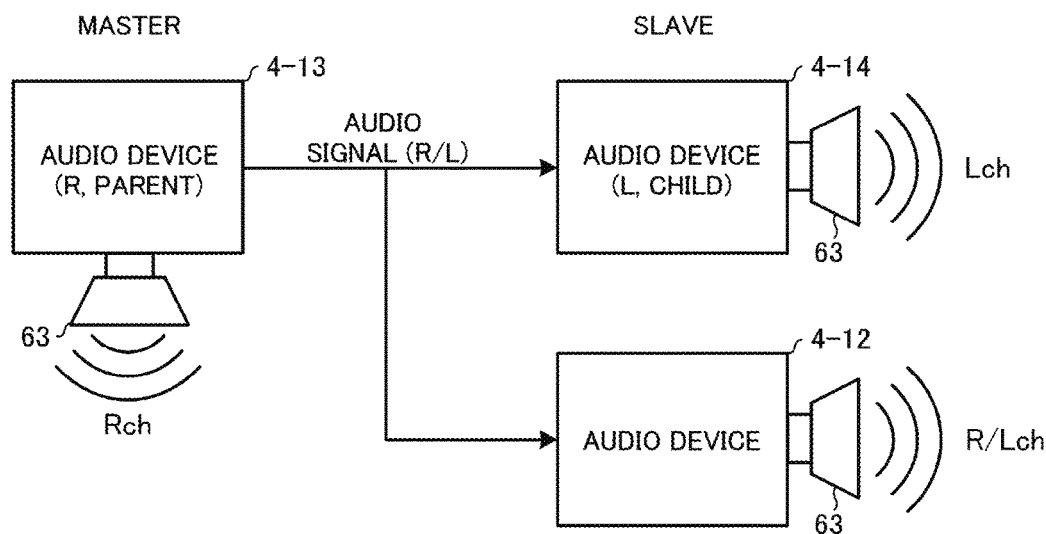
FIG. 14A and FIG. 14B are explanatory diagrams for illustrating modes of transmitting an audio signal between audio devices that belong to a group in synchronous play.
Figure 14B:
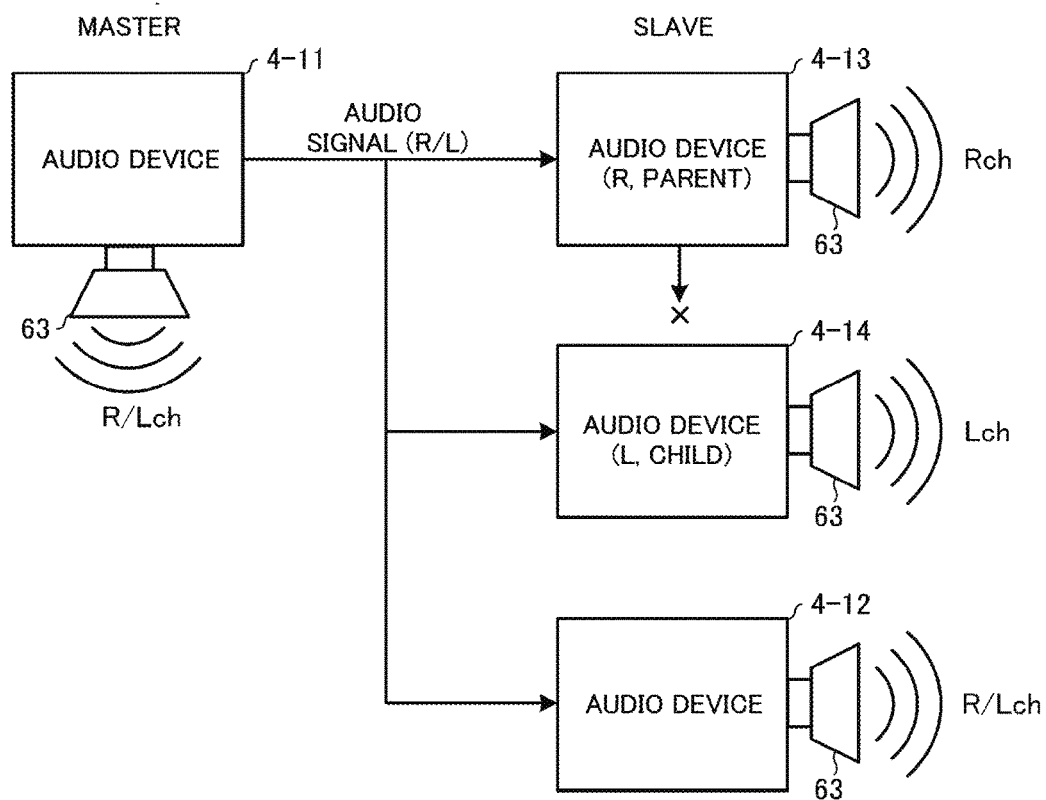
Figure 15A:
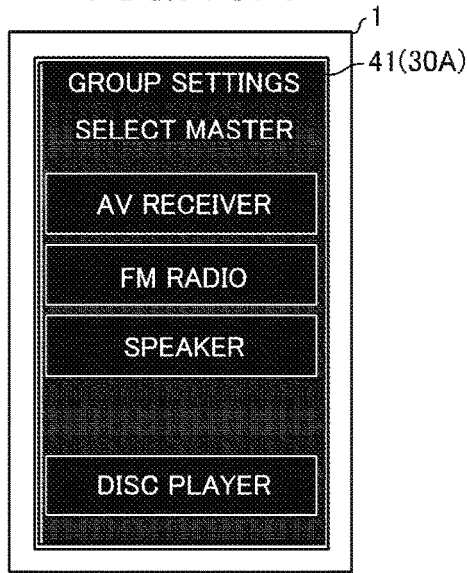
FIG. 15A and FIG. 15B are diagrams for illustrating an example of operation screens of the mobile phone.
Figure 15B:
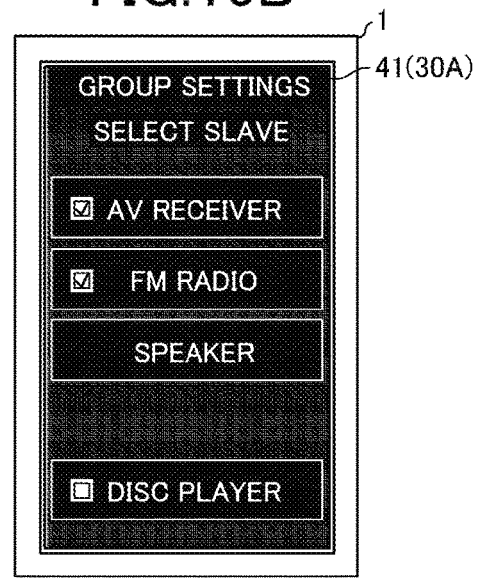

Group setting and synchronous play are described next with reference to FIG. 13 to FIG. 15B. FIG. 13 is another diagram for illustrating the system management table. FIG. 14A and FIG. 14B are explanatory diagrams for illustrating modes of transmitting an audio signal between the audio devices 4 that belong to a group in synchronous play. FIG. 15A and FIG. 15B are diagrams for illustrating an example of operation screens that are displayed on the controller 1 in group setting.

As described above, the group settings in the system management table are information about the audio devices 4 belonging to a group that performs synchronous play in the audio system 10. Specifically, the group settings include a group number and master/slave information as those illustrated in FIG. 13. The group number is information used to identify a group to which the audio device 4 belongs. The master/slave information is used to identify whether the audio device 4 is a master or a slave in synchronous play.

A master handles the supply of an audio source (content) to the entire group (the distribution of an audio signal) and the control of synchronous play, and also functions as one of the devices that take part in synchronous play. For example, the master notifies play start timing and the like to each (slave) audio device 4, so that the slaves can perform synchronous play. A slave plays a received audio source (audio signal) under instruction from the synchronous play master. In FIG. 13, for example, the audio devices 4-12 to 4-14 belong to a group 1, the audio device 4-13 is set as a master, and the audio devices 4-12 and 4-14 are set as slaves.

The control of synchronous play can employ a common technology as the one described in JP 2015-100085 A, and a detailed description on the control is omitted. The number of audio devices 4 that can belong to one group is two or more in this embodiment.

In this embodiment, a parent device and a child device that are set as a stereo pair may be included among the audio devices 4 that belong to a group. The parent device and the child device in this case perform stereo play as synchronous play of content that is played synchronously with the other audio devices 4 belonging to the group. The parent device and the child device are recognized by the user as a unitary audio device, and the parent device alone or the child device alone cannot belong to a group.

In the case where the audio devices 4 that are set as a stereo pair belong to a group, play processing varies when the audio device 4 that serves as a master is the parent device in stereo pair setting (FIG. 14A) and when the master is the audio device 4 that is not set as a stereo pair (FIG. 14B), although the audio signal distributed (transmitted) from the master is the same in the two cases.

Specifically, the parent device functioning as a master performs delayed play, whereas the parent device functioning as a slave does not perform delayed play and performs undelayed play as the child device does. The parent device functioning as a slave does not transmit an audio signal (R/L) to the child device. In this embodiment, no child device functions as a master. This is because the parent device and the child device are recognized by the user as a unitary audio device and, consequently, the user cannot set the child device as a master in group setting.

A case where the master is the parent device 4-13 (audio device 4-13) as in FIG. 14A is described as an example. A group illustrated in FIG. 14A has the parent device 4-13 as the master and the audio device 4-12 and the child device 4-14 (audio device 4-14) as slaves.

The parent device 4-13, which is the master, copies an audio signal (R/L) that is content to be played synchronously to obtain three audio signals (R/L) for distribution, and distributes (transmits) the audio signals (R/L) from the wireless LAN communication unit 56 to the audio device 4-12 and the child device 4-14, which are slaves. The parent device 4-13 separates an Rch audio signal (R) from one of the audio signals (R/L) created by copying for distribution, and outputs the audio signal (R) to the power amplifier 55 via the buffer 54 (delayed play).

Meanwhile, the audio device 4-12 and the child device 4-14 start playing at a synchronous play start time specified by the parent device 4-13, which is the master. The child device 4-14 separates an audio signal (L) from the received audio signal (R/L), and outputs the audio signal (L) to the power amplifier 55 without involving the buffer 54 (undelayed play). An Rch sound and an Lch sound are thus output from the speaker 63 of the parent device 4-13 and the speaker 63 of the child device 4-14, respectively (stereo output). The speaker 63 of the audio device 4-12 outputs, for example, a signal that is obtained by downmixing the received audio signal (R/L), by outputting the mixed audio signal to the power amplifier 55 (monaural output) without involving the buffer 54.

A case where the master is the audio device 4-11, which is not a parent device, as in FIG. 14B is described next. A group illustrated in FIG. 14B has the audio device 4-11 as a master and has the audio device 4-12, the parent device 4-13 (audio device 4-13), and the child device 4-14 (audio device 4-14) as slaves.

The audio device 4-11, which is the master, copies an audio signal (R/L) that is content to be played synchronously to obtain four audio signals (R/L) for distribution, and distributes (transmits) the audio signals (R/L) from the wireless LAN communication unit 56 to the audio device 4-12, the parent device 4-13, and the child device 4-14, which are slaves. The audio device 4-11 performs, for example, downmixing on one of the audio signals (R/L) created by copying for distribution, and outputs the mixed audio signal to the power amplifier 55 (monaural output) without involving the buffer 54.

Meanwhile, the audio device 4-12, the parent device 4-13, and the child device 4-14 start playing at a synchronous play start time specified by the audio device 4-11, which is the master. The parent device 4-13 and the child device 4-14 in this case separate an audio signal (R) and an audio signal (L), respectively, from the received audio signals (R/L), and each output the separated audio signal to the power amplifier 55 (stereo output) without involving the buffer 54 (undelayed play). The parent device 4-13 does not transmit an audio signal (R/L) to the child device 4-14.

Group setting is described next with reference to FIG. 15A and FIG. 15B. Group setting can be executed by the user operating the touch panel 30A of the controller 1. FIG. 15A is a diagram for illustrating an operation screen (display unit 41) used to select the audio device 4 that is to function as a master in group setting. FIG. 15B is a diagram for illustrating an operation screen (display unit 41) used to select the audio devices 4 that are to function as slaves in group setting.

The audio devices 4 that are to belong to a group are selected by allowing the user to select first one audio device 4 that functions as a master. After that, the user selects one or more audio devices 4 that are to function as slaves. Lastly, an enter button (not shown) is selected to complete group setting.

The operation screen on which a master and slaves are selected displays the device type names of the audio devices 4. Only the device type name of the parent device is displayed in this embodiment out of the device type names of the audio devices 4 that are set as a stereo pair. In the case of the parent device is the audio device 4-13 and the child device is audio device 4-14, for example, only the device type name of the parent device 4-13, "speaker", is displayed and the device type name of the child device 4-14 is not displayed. The operation screens in this case may display device type names in a manner that enables the user to identify audio devices that are currently set as a stereo pair. For example, "speaker (pair)" may be displayed as the device type name of the parent device 4-13. When stereo pair settings are subsequently cancelled, the device type name of the audio device 4-13 is returned to "speaker", and the device type name of the audio device 4-14, "speaker", is displayed.

Figure 16:
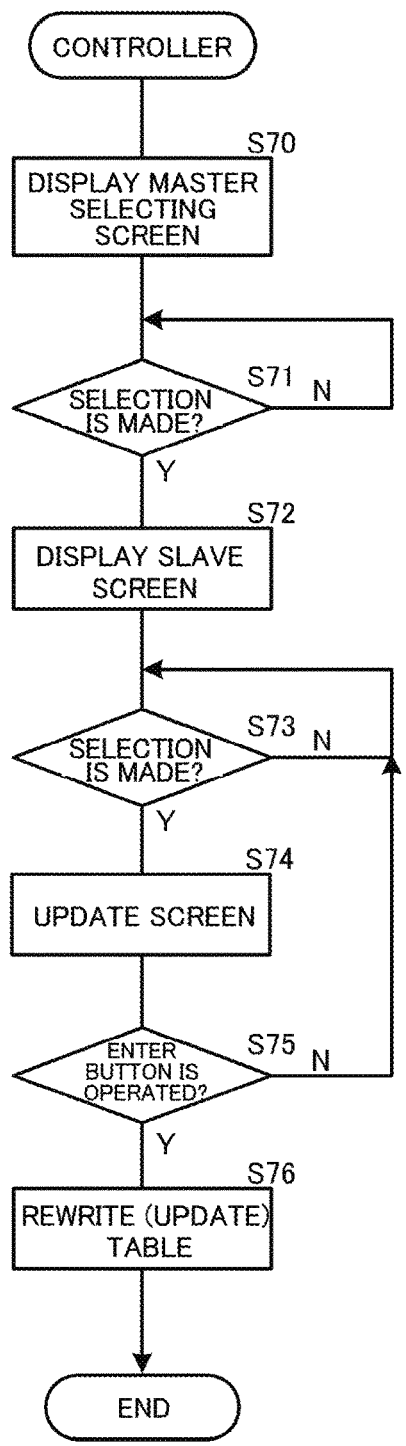
FIG. 16 is a flow chart for illustrating group setting processing, which is executed by a control unit of the mobile phone.

The group setting processing described above is further described with reference to FIG. 16. The group setting processing is executed by the controller 1 when the user operates the controller 1 so that an operation screen as the one illustrated in FIG. 14A is displayed.

The controller 1 first displays an operation screen used to select a master, as the one illustrated in FIG. 15A (Step S70), and stands by until the audio device 4 that functions as the master is selected by the user (Step S71). When the audio device 4 that functions as the master is selected ("YES" in Step S71), the controller 1 displays an operation screen used to select slaves, as the one illustrated in FIG. 15B (Step S72), and stands by until the audio device 4 that functions as a slave is selected by the user (Step S73). The operation screen is displayed so that the audio device 4 that is selected as a master cannot be selected as a slave. For example, a "speaker (the parent device 4-13)" selected as a master in FIG. 15A is excluded from slave options in FIG. 15B.

When one audio device 4 that functions as a slave is selected ("YES" in Step S73), the controller 1 updates what is displayed on the operation screen so that the selected audio device 4 can be identified (Step S74). For example, a check mark is displayed in a check box for the selected audio device 4 as illustrated in FIG. 15B. After that, the controller 1 executes Step S73 and Step S74 repeatedly until the enter button (icon image) is operated (Step S75).

When the enter button is operated ("YES" in Step S75), the controller 1 updates the system management table (Step S76). Specifically, the group setting information is updated. In the case where the parent device is selected as the audio device 4 that belongs to a Group, the Group setting information in the system management table is updated also on the child device as the audio device 4 that belongs to the group as a slave. For example, in the case where the parent device 4-13 is selected as a member of a group 1 as illustrated in FIG. 13, the group setting information is updated so that the child device 4-14 also belongs to the group 1 as a slave.

After that, the updated system management table is transmitted from the controller 1 to each audio device 4.

Figure 17A:
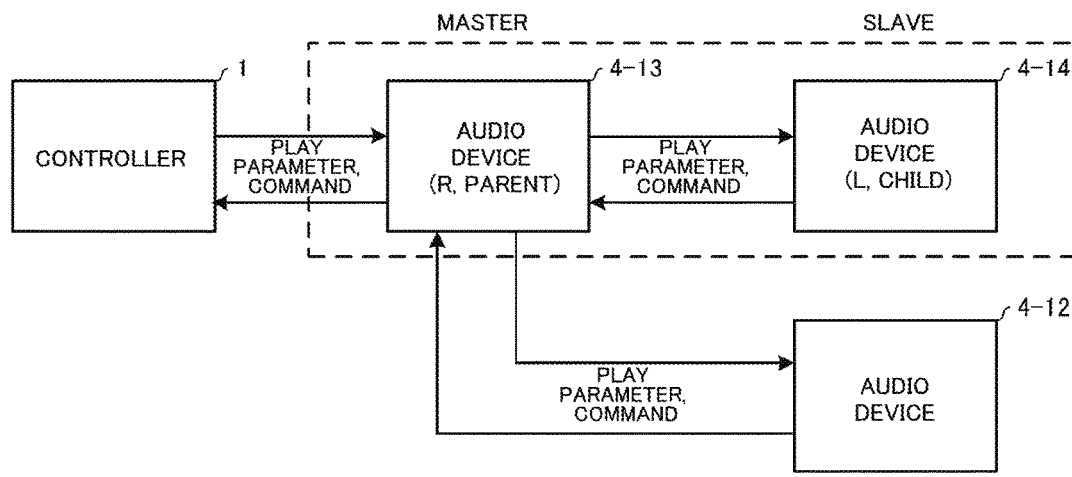
FIG. 17A and FIG. 17B are explanatory diagrams for illustrating modes of transmitting a command between audio devices that belong to a group in synchronous play.
Figure 17B:
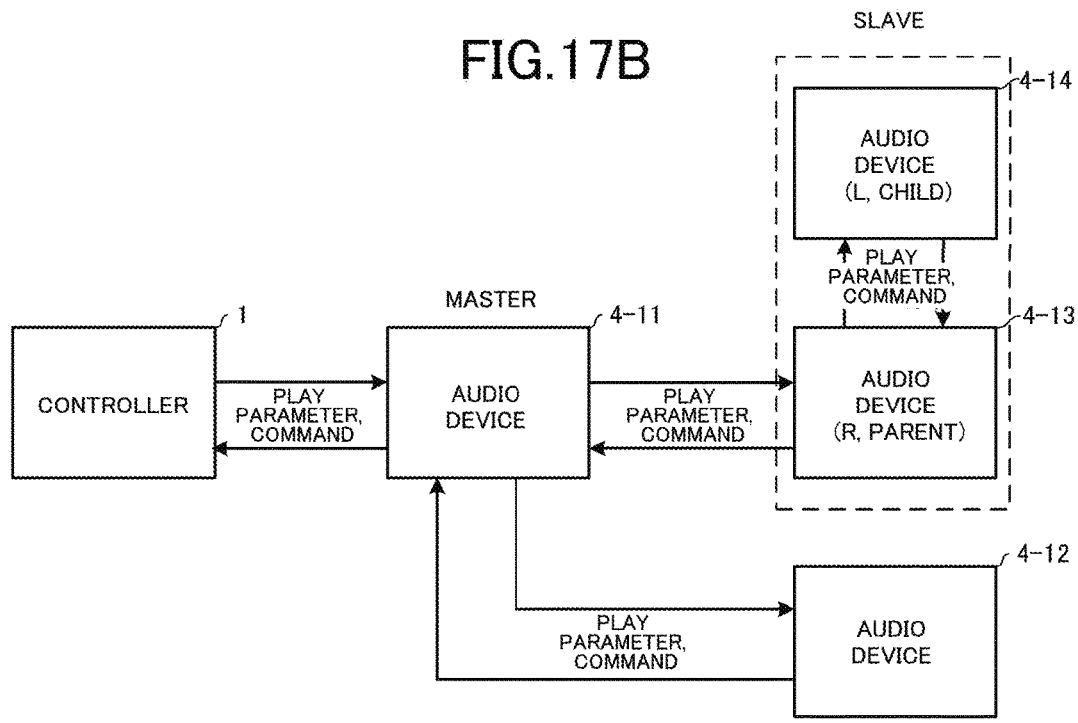

A description is given next with reference to FIG. 17A and FIG. 17B on play parameter update processing and play/stop command transmission processing that are executed by the audio devices 4 set as a group for synchronous play.

Unlike the parent device and the child device set as a stereo pair, the audio devices 4 belonging to a group are allowed to change their play parameters individually, and the play parameter of one audio device 4 can be changed by the operation unit 30 of the controller 1 or by the operation unit 59 of the audio device 4. The controller 1 can set the same settings on a volume and the like for all the audio devices 4 that belong to a group, and can also set individual settings on a volume and the like for each of the audio devices 4.

A play/stop command in synchronous play, too, can be input by the operation unit 30 of the controller 1 or the operation unit 59 of each audio device 4 belonging to a group.

When the audio devices 4 set as a stereo pair belong to a group, the child device is treated as one with the parent device in an update of the play parameter and other updates as described with reference to FIG. 9 to FIG. 12. Commands including a command to update the play parameter are therefore not transmitted to the child device from the audio devices 4 belonging to the group that are not the parent device. The child device always receives commands via the parent device.

A description is given on an exemplary case in which the parent device 4-13 is the master of a group and the child device 4-14 and the audio device 4-12 belong to the group as slaves as illustrated in FIG. 17A. When it is the controller 1 that issues an update command, a play/stop command, or other commands, the issued command is transmitted first from the controller 1 to the parent device 4-13, which is the master, and then from the parent device 4-13 to the child device 4-14 and the audio device 4-12 separately. When it is the parent device 4-13 functioning as the master that issues an update command, a play/stop command, or other commands, the issued command is transmitted from the parent device 4-13 to the controller 1, the child device 4-14, and the audio device 4-12 separately.

When it is the child device 4-14 that issues an update command, a play/stop command, or other commands, the issued command is transmitted from the child device 4-14 only to the parent device 4-13, and then transmitted from the parent device 4-13 to the controller 1 and the audio device 4-12.

When it is the audio device 4-12 that issues an update command, a play/stop command, or other commands, the issued command is transmitted from the audio device 4-12 only to the parent device 4-13, and then transmitted from the parent device 4-13 to the controller 1 and the child device 4-14.

A description is given next on a case in which the audio device 4-11 is the master of a group and the parent device 4-13, the child device 4-14, and the audio device 4-12 belong to the group as slaves as illustrated in FIG. 17B.

When it is the controller 1 that issues an update command, a play/stop command, or other commands, the issued command is transmitted first from the controller 1 to the audio device 4-11, which is the master, and then from the audio device 4-11 to the parent device 4-13 and the audio device 4-12 separately. The command is subsequently transmitted from the parent device 4-13 to the child device 4-14.

When it is the audio device 4-11 being the master that issues an update command, a play/stop command, or other commands, the issued command is transmitted first from the audio device 4-11, to the controller 1, the parent device 4-13, and the audio device 4-12 separately. The command is subsequently transmitted from the parent device 4-13 to the child device 4-14.

When it is the parent device 4-13 that issues an update command, a play/stop command, or other commands, the issued command is transmitted first from the parent device 4-13 to the audio device 4-11 and the child device 4-14 separately. The command is subsequently transmitted from the audio device 4-11 to the controller 1 and the audio device 4-12.

Next, when it is the child device 4-14 that issues an update command, a play/stop command, or other commands, the issued command is transmitted from the child device 4-14 only to the parent device 4-13, and then transmitted from the parent device 4-13 only to the audio device 4-11. The command is subsequently transmitted from the audio device 4-11 to the controller 1 and the audio device 4-12.

When it is the audio device 4-12 that issues an update command, a play/stop command, or other commands, the issued command is transmitted from the audio device 4-12 only to the audio device 4-11, and then transmitted from the audio device 4-11 to the controller 1 and the parent device 4-13. The command is subsequently transmitted from the parent device 4-13 to the child device 4-14.

Two audio devices 4 paired for synchronous play can thus play content in stereo while synchronizing the setting information about play. The functionality of the audio system 10 is accordingly improved.

In the embodiment described above, the mobile phone 1, which executes the audio system control program 70, is capable of controlling synchronous play and other operations of the audio devices 4 as the controller 1 while sharing the system management table. Synchronous play and other operations of the audio devices can be controlled also by a mobile phone that executes a different audio system control program as a controller. In the case of a controller that does not have a stereo pair setting function, however, the audio device 4 set as a child device does not respond to the controller and only its parent device responds to the controller. Specifically, the audio device 4 set as a child device does not respond to a connection request issued by the controller, and only the audio device 4 that is not a child device responds to the request. When a play command is transmitted from this controller to the parent device, for example, the play command and an audio signal are transmitted from the parent device to the child device to play audio in stereo on the parent device and the child device as described above.

A controller is identified by, for example, transmitting a command that includes identification information for identifying an application program activated on the controller. Stereo pair setting is executed between the audio devices 4, which means that stereo pair setting as well as the stereo play described above can be conducted even when the connected controller does not have a stereo pair setting function.

While only one stereo pair is set in the embodiment described above, a plurality of stereo pairs may be set.

Figure 7:
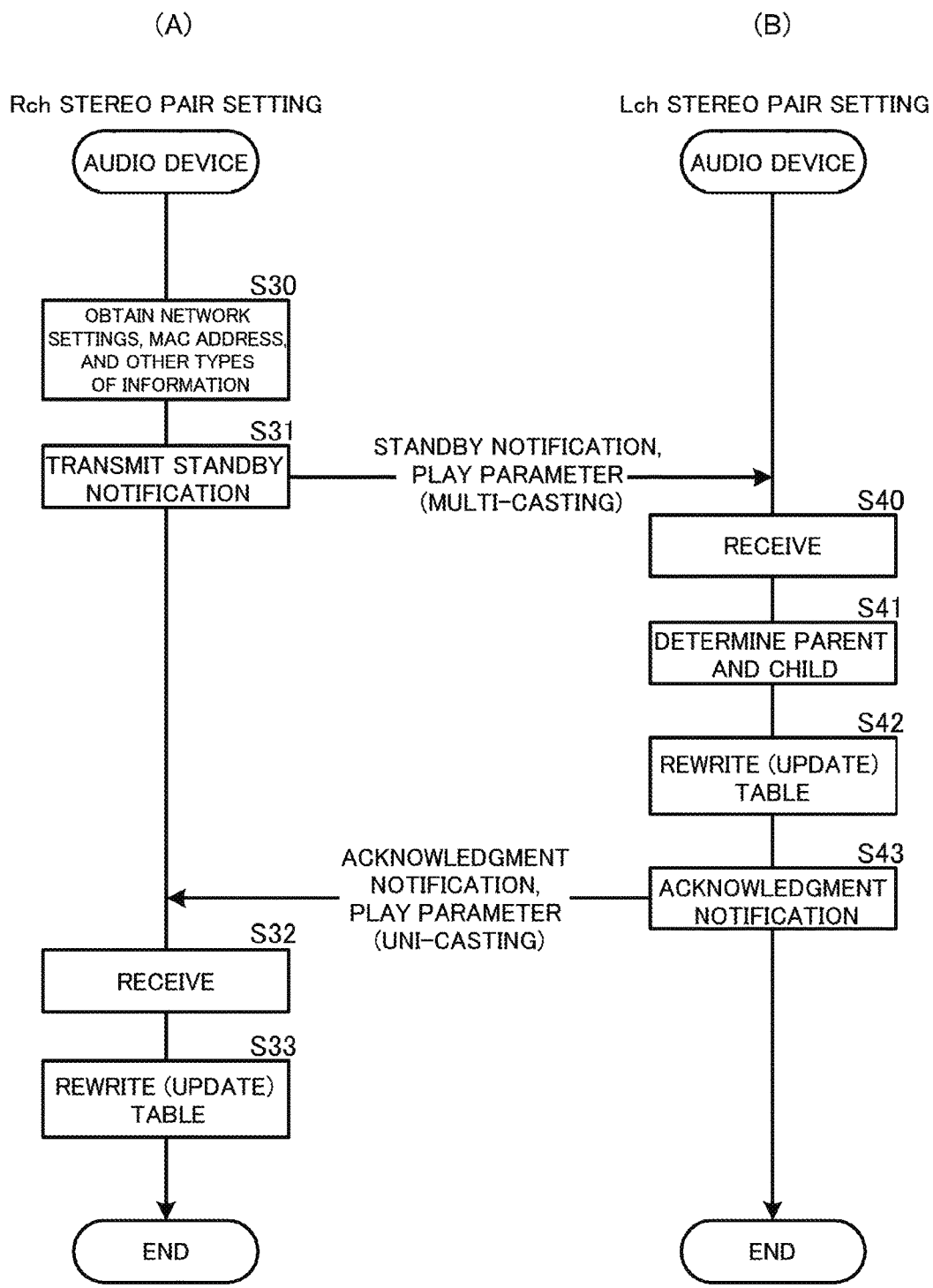
FIG. 7 is a flow chart for illustrating Rch stereo pair setting processing and Lch stereo pair setting processing, which are executed by the control units of the audio devices.

The present invention is not particularly limited to the configuration of the embodiment described above in which one audio device searches for another audio device to be paired with the one audio device as a stereo pair as illustrated in FIG. 7. The user may manually set stereo pair settings including a played channel and a parent-child relation. The stereo pair setting may also be executed on a mobile phone.

In the embodiment described above, when only the play/stop button 59B of one audio device 4 is held down (3 seconds, for example), a light comes on to inform of the state of a play channel of the audio device 4 in stereo pair setting. The reception of a given command from the controller (mobile phone) 1 may instead be used as the condition for the informing. For example, the user operates the operation unit 30 of the controller 1 to input an instruction for the informing, which causes the controller 1 to transmit a given command to the parent device. The given command is transmitted from the parent device to the child device, and causes the LEDs 62 of the parent device and the child device 62 to blink in manners based on play channel settings.

While every audio device belonging to an audio system can be set as a half of a stereo pair in the embodiment described above, an audio system may include an audio device that is not set as a half of a stereo pair. A terminal device as used in the appended claims corresponds to, for example, the controller described above.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An audio device, comprising:
   at least one processor; and
   at least one memory device that stores a plurality of instructions, which when executed by the at least one processor, cause the at least one processor to:
   play a first-channel audio signal included in an audio signal with a given length of delay by at least temporarily storing the first-channel audio signal in a buffer and then outputting the temporarily stored first-channel audio signal from the buffer to an amplifier, the audio signal having the first-channel audio signal and a second-channel audio signal different from the first-channel audio signal;
   obtain one of operation information about operation of the audio device and setting information about playing of the audio signal; and
   transmit one of the operation information and the setting information, and at least the second-channel audio signal included in the audio signal, to another audio device to thereby cause the another device to play the second-channel audio signal by at least outputting the second-channel audio signal to an amplifier without temporarily storing the second-channel audio signal in a buffer, such that the first-channel audio signal and the second-channel audio signal are played in a synchronized state.

2. An audio signal playback method, comprising:
   playing, by a parent device, a first-channel audio signal included in an audio signal with a given length of delay by at least temporarily storing the first-channel audio signal in a buffer and then outputting the temporarily stored first-channel audio signal from the buffer to an amplifier, the audio signal having the first-channel audio signal and a second-channel audio signal different from the first-channel audio signal;
   obtaining, by a child device, at least the second-channel audio signal included in the audio signal from the parent device, and playing the second-channel audio signal by at least outputting the second-channel audio signal to an amplifier without temporarily storing the second-channel audio signal in a buffer, such that the first-channel audio signal and the second-channel audio signal are played in a synchronized state;
   obtaining, by an operation unit, one of: operation information about operation of one of the parent device and the child device, and setting information about playing of the audio signal; and
   transferring one of the operation information and the setting information to another one of the parent device and the child device.

3. The audio signal playback method according to claim 2, wherein:
   the operation unit is provided to one of the parent device and the child device.

4. The audio signal playback method according to claim 2, wherein:
the operation unit is provided to a terminal device, which is capable of communication to and from one of the parent device and the child device.

5. The audio signal playback method according to claim 2, further comprising transferring one of the operation information and the setting information via the parent device to one of the child device and a terminal device.

6. The audio signal playback method according to claim 2, wherein the operation information includes one of an instruction to play the audio signal and an instruction to stop the playing of the audio signal.

7. The audio signal playback method according to claim 2, further comprising obtaining, by one of the parent device and the child device, the setting information transferred during a period in which the audio signal is being played, and playing one of the first-channel audio signal and the second-channel audio signal, depending on the setting information.

8. The audio signal playback method according to claim 2, wherein the setting information includes information about one of a volume and equalization of the audio signal.

9. The audio signal playback method according to claim 2, further comprising setting one of two audio devices, which are included in an audio system, and have the same configuration, as the parent device and another one of the two audio devices as the child device.

10. An audio system, comprising:
a parent device configured to play a first-channel audio signal included in an audio signal with a given length of delay by at least temporarily storing the first-channel audio signal in a buffer and then outputting the temporarily stored first-channel audio signal from the buffer to an amplifier, the audio signal having the first-channel audio signal and a second-channel audio signal different from the first-channel audio signal;
a child device configured to obtain at least the second-channel audio signal included in the audio signal from the parent device, and play the second-channel audio signal by at least outputting the second-channel audio signal to an amplifier without temporarily storing the second-channel audio signal in a buffer, such that the first-channel audio signal and the second-channel audio signal are played in a synchronized state; and
an operation unit configured to obtain one of: operation information about operation of one of the parent device and the child device, and setting information about playing of the audio signal,
wherein one of the operation information and the setting information is transferred to another one of the parent device and the child device.

\* \* \* \* \*